United States Patent
Law et al.

(10) Patent No.: US 8,247,906 B2
(45) Date of Patent: Aug. 21, 2012

(54) SUPPLYING POWER TO INTEGRATED CIRCUITS USING A GRID MATRIX FORMED OF THROUGH-SILICON VIAS

(75) Inventors: Oscar M. K. Law, Hsin-Chu (TW); Kuo H. Wu, Hsin-Chu (TW); Wei-Chih Yeh, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 178 days.

(21) Appl. No.: 12/769,334

(22) Filed: Apr. 28, 2010

(65) Prior Publication Data

US 2011/0001249 A1 Jan. 6, 2011

Related U.S. Application Data

(60) Provisional application No. 61/223,315, filed on Jul. 6, 2009.

(51) Int. Cl.
*H01L 23/48* (2006.01)
(52) U.S. Cl. .................. 257/774; 257/776; 257/E23.067
(58) Field of Classification Search .................. 257/774, 257/776, E23.067
See application file for complete search history.

(56) References Cited

U.S. PATENT DOCUMENTS

| | | | |
|---|---|---|---|
| 5,391,917 A | 2/1995 | Gilmour et al. | |
| 5,510,298 A | 4/1996 | Redwine | |
| 5,767,001 A | 6/1998 | Bertagnolli et al. | |
| 5,998,292 A | 12/1999 | Black et al. | |
| 6,184,060 B1 | 2/2001 | Siniaguine | |
| 6,322,903 B1 | 11/2001 | Siniaguine et al. | |
| 6,448,168 B1 | 9/2002 | Rao et al. | |
| 6,465,892 B1 | 10/2002 | Suga | |
| 6,472,293 B1 | 10/2002 | Suga | |
| 6,538,333 B2 | 3/2003 | Kong | |
| 6,599,778 B2 | 7/2003 | Pogge et al. | |
| 6,639,303 B2 | 10/2003 | Siniaguine | |
| 6,664,129 B2 | 12/2003 | Siniaguine | |
| 6,693,361 B1 | 2/2004 | Siniaguine et al. | |
| 6,740,582 B2 | 5/2004 | Siniaguine | |
| 6,800,930 B2 | 10/2004 | Jackson et al. | |
| 6,841,883 B1 | 1/2005 | Farnworth et al. | |
| 6,882,030 B2 | 4/2005 | Siniaguine | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |
| 7,034,401 B2 * | 4/2006 | Savastiouk et al. | 257/778 |
| 7,049,170 B2 | 5/2006 | Savastiouk et al. | |
| 7,060,601 B2 | 6/2006 | Savastiouk et al. | |
| 7,071,546 B2 | 7/2006 | Fey et al. | |
| 7,111,149 B2 | 9/2006 | Eilert | |
| 7,122,912 B2 | 10/2006 | Matsui | |
| 7,157,787 B2 | 1/2007 | Kim et al. | |
| 7,193,308 B2 | 3/2007 | Matsui | |
| 7,262,495 B2 | 8/2007 | Chen et al. | |
| 7,297,574 B2 | 11/2007 | Thomas et al. | |
| 7,335,972 B2 | 2/2008 | Chanchani | |

(Continued)

*Primary Examiner* — Allan R Wilson
(74) *Attorney, Agent, or Firm* — Slater & Matsil, L.L.P.

(57) ABSTRACT

An integrated circuit structure includes a chip including a substrate and a power distribution network. The power distribution network includes a plurality of power through-silicon vias (TSVs) penetrating the substrate, wherein the plurality of power TSVs forms a grid; and a plurality of metal lines in a bottom metallization layer (M1), wherein the plurality of metal lines couples the plurality of power TSVs to integrated circuit devices on the substrate.

20 Claims, 20 Drawing Sheets

U.S. PATENT DOCUMENTS

| | | | |
|---|---|---|---|
| 7,355,273 | B2 | 4/2008 | Jackson et al. |
| 7,825,024 | B2* | 11/2010 | Lin et al. .................. 438/637 |
| 2002/0153616 | A1* | 10/2002 | Kunihisa et al. ............ 257/778 |
| 2003/0111733 | A1* | 6/2003 | Pogge et al. ................ 257/774 |
| 2004/0188826 | A1* | 9/2004 | Palanduz et al. ............ 257/700 |
| 2005/0139987 | A1* | 6/2005 | Okada et al. ............... 257/700 |
| 2008/0169120 | A1* | 7/2008 | Inagaki et al. .............. 174/255 |
| 2008/0182361 | A1* | 7/2008 | Horton et al. ............... 438/109 |
| 2009/0085217 | A1* | 4/2009 | Knickerbocker et al. .... 257/774 |
| 2010/0148336 | A1* | 6/2010 | Do et al. .................... 257/686 |
| 2010/0171226 | A1* | 7/2010 | West et al. ................. 257/774 |
| 2010/0252934 | A1* | 10/2010 | Law et al. ................... 257/774 |

* cited by examiner

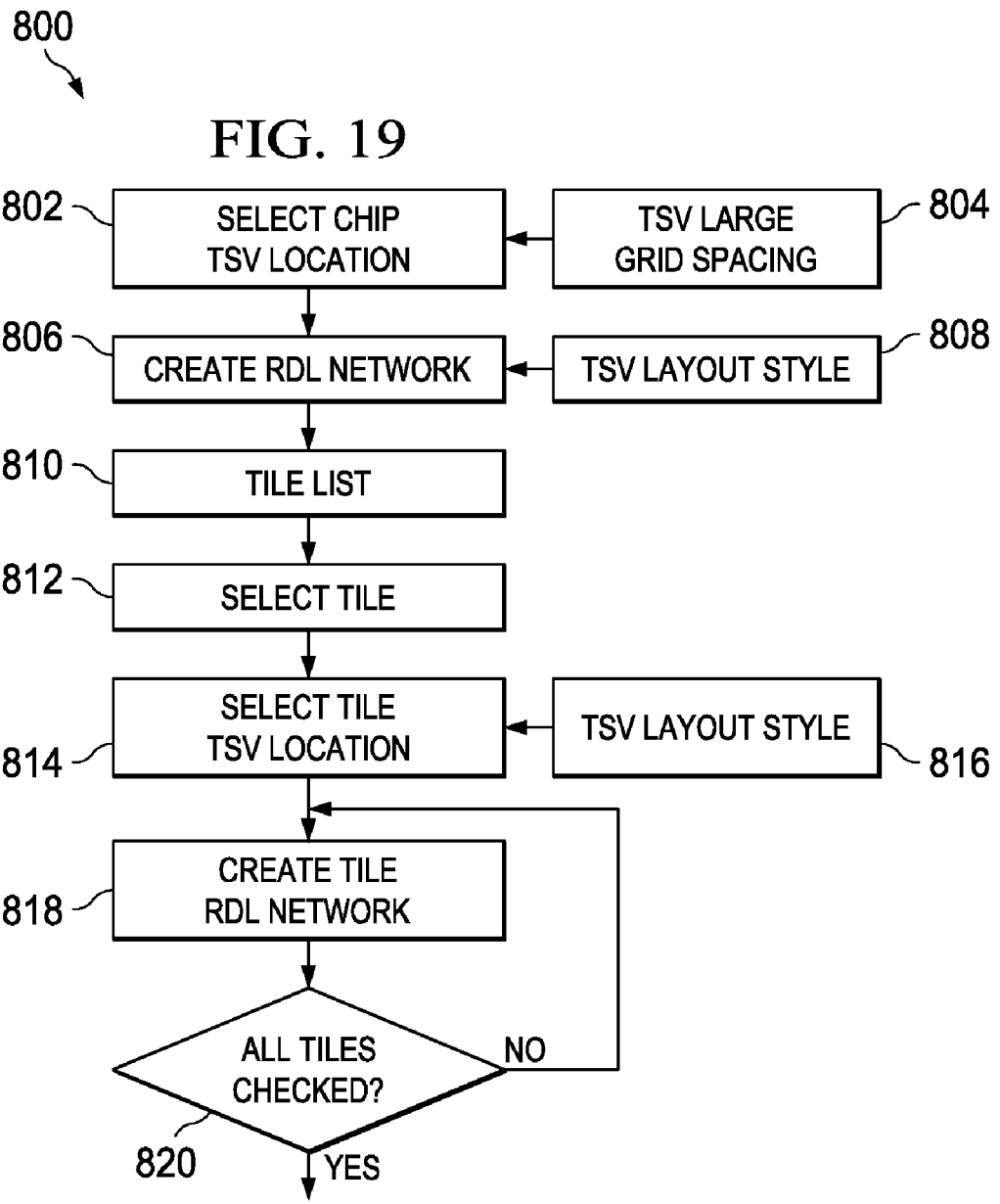

US 8,247,906 B2

SUPPLYING POWER TO INTEGRATED CIRCUITS USING A GRID MATRIX FORMED OF THROUGH-SILICON VIAS

This application claims the benefit of U.S. Provisional Application No. 61/223,315 filed on Jul. 6, 2009, entitled "Supplying Power to Integrated Circuits Using a Grid Matrix Formed of Through-Silicon Vias," which application is hereby incorporated herein by reference.

TECHNICAL FIELD

This invention relates generally to integrated circuit structures, and more particularly to structures for supplying power to integrated circuits.

BACKGROUND

For the operation of integrated circuits, power must be supplied and distributed appropriately. This requires the appropriate distribution of operation voltages VDD and VSS. FIG. 1, which is a top view of a semiconductor chip, illustrates a power distribution scheme for distributing operation voltages VDD and VSS throughout a chip. VDD lines 10, which form a mesh, are distributed throughout the respective chip and carry operation voltage VDD. VSS lines 14, which also form a mesh, are distributed throughout the respective chip and carry operation voltage VSS. VDD pads 12 and VSS pads 16 are formed on the top surface of the respective semiconductor chip to receive the VDD and VSS voltage, respectively, from outside the chip.

With advanced technologies for forming circuits having small sizes, the design complexity is increased dramatically, which leads to a high power dissipation. Accordingly, a large number of power pads 12 and 16 are required for internal circuit current supply. In addition, a dense power mesh is needed for minimizing IR drop. Due to pad-pitch limitations, the sizes of pads 12 and 16 cannot be reduced, and a great amount of chip area, which may be as great as 20 to 30 percent or even greater, is occupied by power pads 12 an 16. In addition, a significant amount of routing resource is taken by the power mesh. This results in a significant increase in the chip size as well as production cost.

FIG. 2 illustrates a cross-sectional view of a chip, which shows how power is supplied to transistors 28 through bump 18, power pads 12/16, power mesh 10/14, and the connecting metal lines 22 and vias 24. It is notice that the power needs to go through a plurality of metal lines and vias before reaching transistors 28. The effective resistance between power mesh 10/14 and transistors 28 thus includes the resistances of metal lines 22 and stacked vias 24, which may reach as high as tens of ohms. The voltage drop caused by current-resistance (IR) is hence high. An additional problem of the conventional power supply scheme as shown in FIGS. 1 and 2 is that stacked metal lines 22 and vias 24 occupy the chip area that otherwise would be used for routing, and hence they block the routing of signals and result in congestion.

SUMMARY OF THE INVENTION

In accordance with one aspect of the present invention, an integrated circuit structure includes a chip comprising a substrate and a power distribution network. The power distribution network includes a plurality of power through-silicon vias (TSVs) penetrating the substrate, wherein the plurality of power TSVs forms a grid; and a first plurality of metal lines in a bottom metallization layer (M1), wherein the first plurality of metal lines couples the plurality of power TSVs to the integrated circuit devices on the substrate.

Other embodiments are also disclosed.

The advantageous features of the present invention include reduced chip area usage, reduced blockage to signal routing due to the power routing, and reduced IR drop.

BRIEF DESCRIPTION OF THE DRAWINGS

For a more complete understanding of the present invention, and the advantages thereof, reference is now made to the following descriptions taken in conjunction with the accompanying drawings, in which:

FIGS. 10 and 14-19 are flow charts of processes for placing power TSVs;

DETAILED DESCRIPTION OF ILLUSTRATIVE EMBODIMENTS

The making and using of the embodiments of the present invention are discussed in detail below. It should be appreciated, however, that the embodiments provide many applicable inventive concepts that can be embodied in a wide variety of specific contexts. The specific embodiments discussed are merely illustrative of specific ways to make and use the invention and do not limit the scope of the invention.

A novel power distribution network, which includes a power grid for supplying power to integrated circuits and the method of designing the same are presented. The variations of the embodiment are discussed. Throughout the various views and illustrative embodiments of the present invention, like reference numbers are used to designate like elements.

Figure 1:
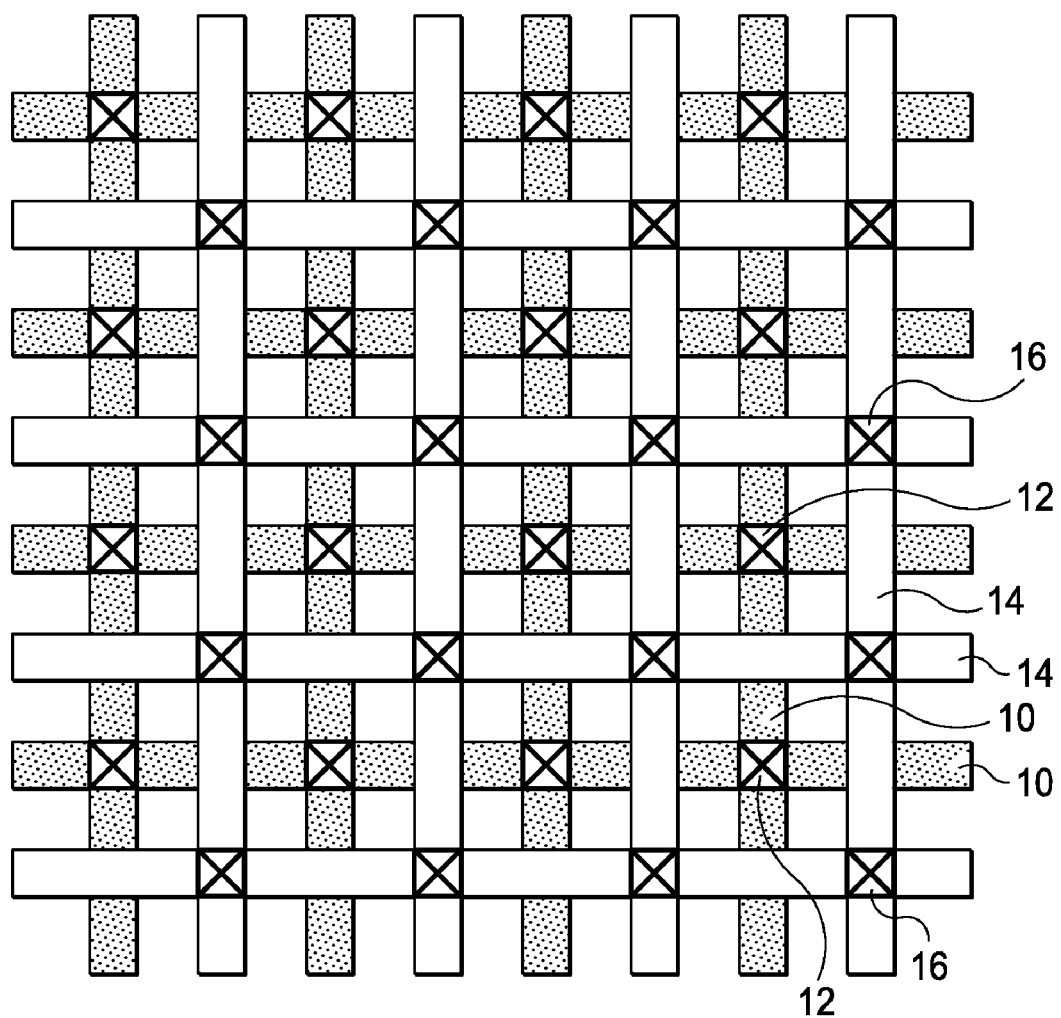
FIG. 1 illustrates a top view of a conventional power mesh.
Figure 2:
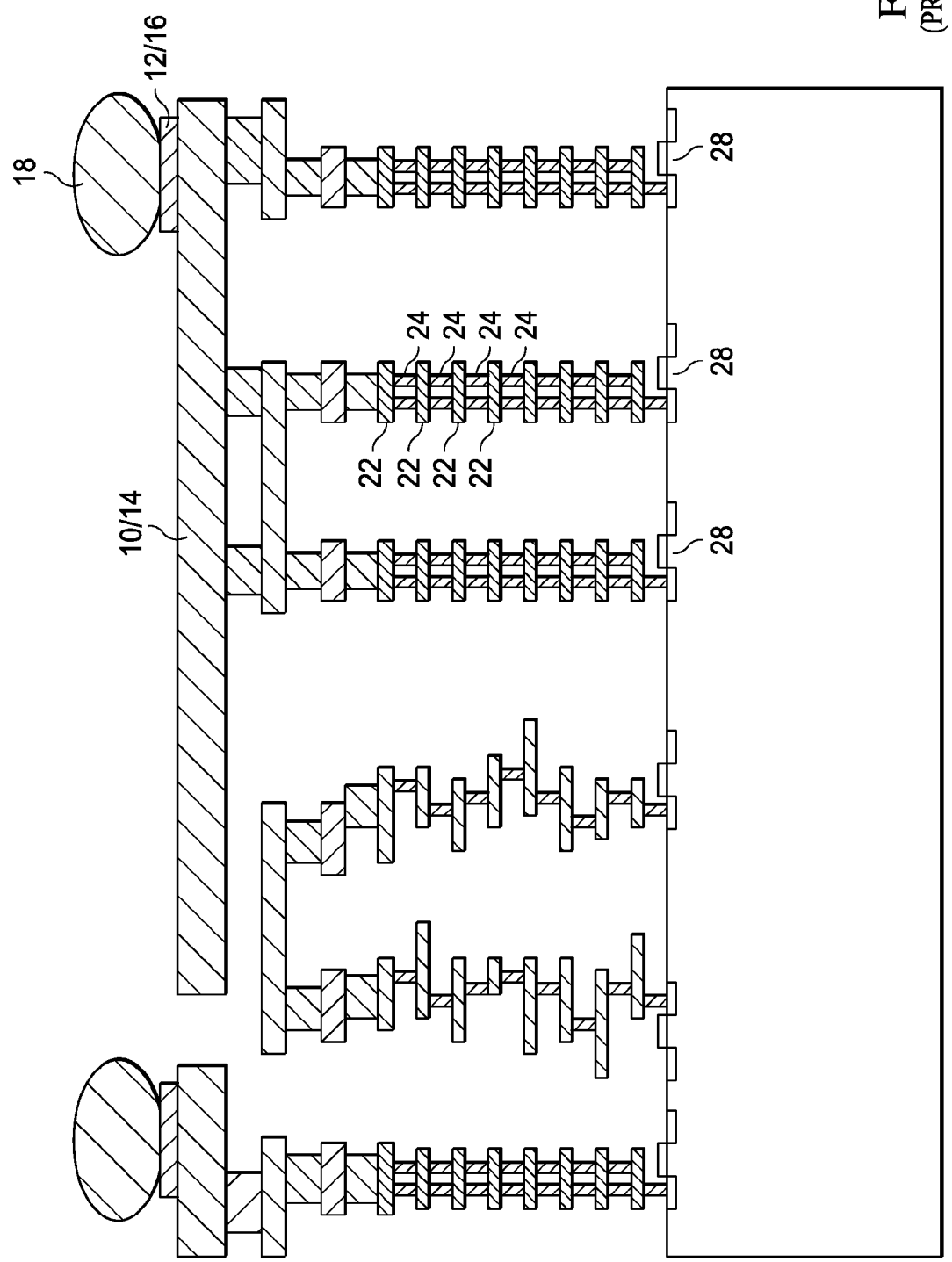
FIG. 2 illustrates a cross-sectional view of a portion of the conventional power mesh.
Figure 3A:
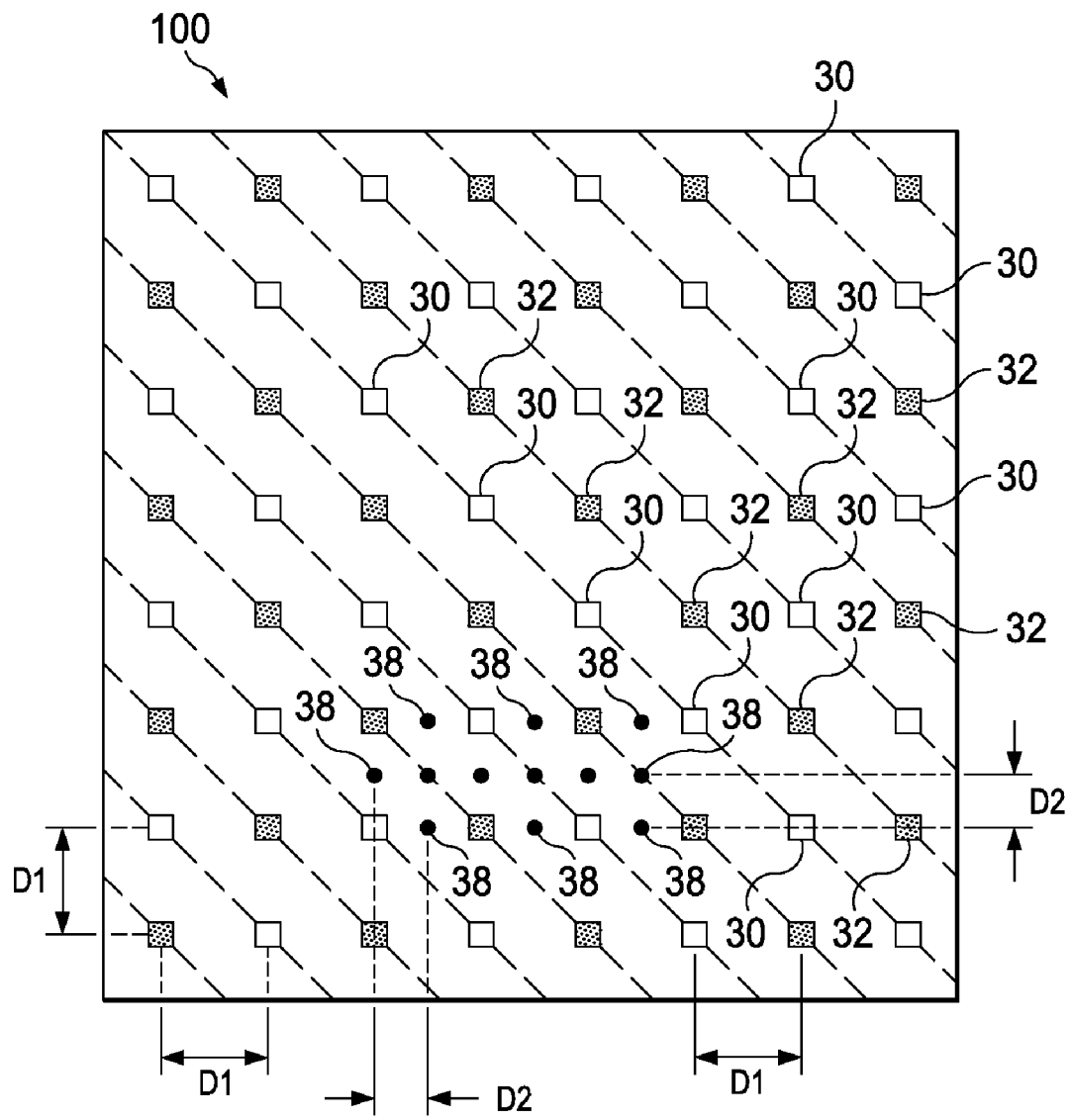
FIGS. 3A and 3B illustrate backside views of chips, wherein power grids are formed of a plurality of through-silicon vias (TSV) in accordance with embodiments of the present invention.
Figure 3B:
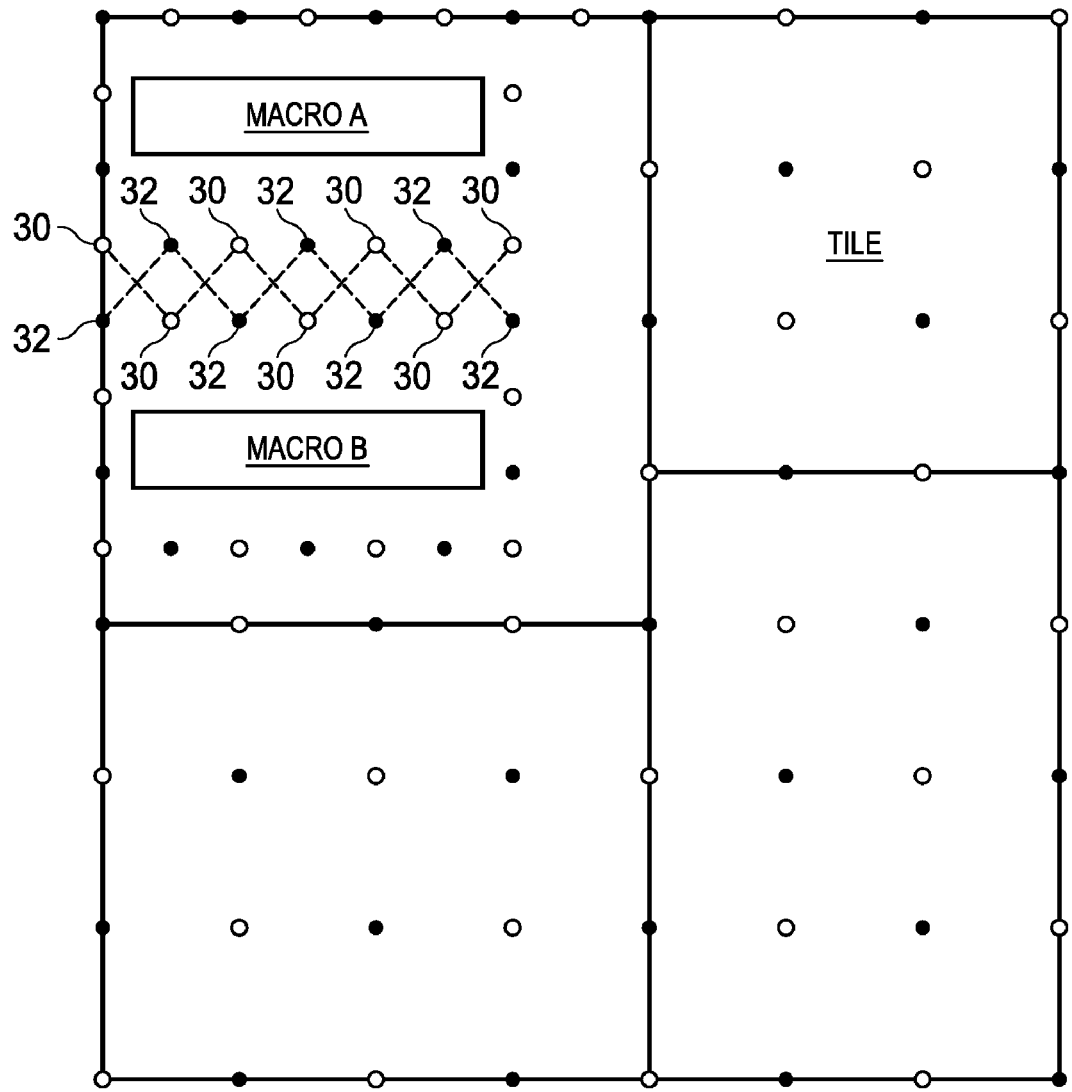

FIG. 3A illustrates a backside view of chip 100, wherein the backside is the side having no active devices, such as transistors formed thereon. The backside is on an opposite side of chip 100 than a front side, at which integrated circuit devices, such as transistors (not shown in FIG. 3, refer to FIG. 5), are formed on the first side. Through-silicon vias (TSVs) 30 (also sometimes referred to as through-substrate vias) and 32 penetrate substrate 34 (not shown in FIG. 3, please refer to FIG. 5), and extend from the backside to the front side. Substrate 34 may be a semiconductor substrate, such as a silicon substrate. TSVs 30 are used for conducting positive operation voltage VDD to the integrated circuits in chip 100, and hence are alternatively referred to as VDD TSVs. TSVs 32 are used for conducting operation voltage VSS, which may be an electrical ground, to the integrated circuits in chip 100, and hence are alternatively referred to as VSS TSVs. TSVs 30 and 32 are also referred to as power TSVs. TSVs 30 and 32 are distributed in a periodic pattern, and may be distributed substantially throughout an entirety of chip 100, that is, TSVs 30 and 32 are distributed from the center of chip 100 to close to edges of chip 100. In alternative embodiments, TSVs 30 and 32 are distributed in a region covering greater than about 1 percent, and even greater than about 5, 20, 50, or even 80 percent of chip 100. In an embodiment, VDD TSVs 30 and VSS TSVs 32 are allocated horizontally along horizontal lines (refer to FIG. 8) parallel to edges of chip 100. In other embodiments, VDD TSVs 30 and VSS TSVs 32 are allocated diagonally along diagonal lines, as is shown as dotted lines in FIG. 3A. It is realized that VDD TSVs 30 and VSS TSVs 32 may also be allocated in many other patterns, such as a zigzag pattern, such as what is shown in FIG. 3B. Macros A and B (wherein the term "Macro" is discussed in subsequent paragraphs.) are located close to each other. Only two rows of TSVs are formed. VDD TSVs 30 form a zigzag pattern, and VSS TSVs 32 form a zigzag pattern.

Each of TSVs 30 and 32 may have a size less than about 10 μm×10 μm. In an exemplary embodiment, the size of each of TSVs 30 and 32 may be about 6 μm×6 μm. When designing TSVs 30 and 32, grids may be designed first, with more than one grid having different grid sizes (the distance between neighboring grid nodes). In an embodiment, a maximum grid among the grids has a grid size of about 30 μm. The maximum grid may also be further divided to form finer grids having smaller sizes. For example, in FIG. 3A, TSVs 30 and 32 are on one grid with grid size D1, while points 38 belong to a grid (with grid size D2) finer than the grid of TSVs 30 and 32. TSVs 30 and 32 may be placed on the grid nodes of the maximum grid. If more power TSVs are needed, the additional power TSVs may be placed on the finer grids. With the grid sizes significantly smaller than the size of chip 100, there will be many TSVs 30 and 32, wherein the number of grids may be greater than about 30 μm×30 μm, or even greater than 250 μm×250 μm.

Figure 4:
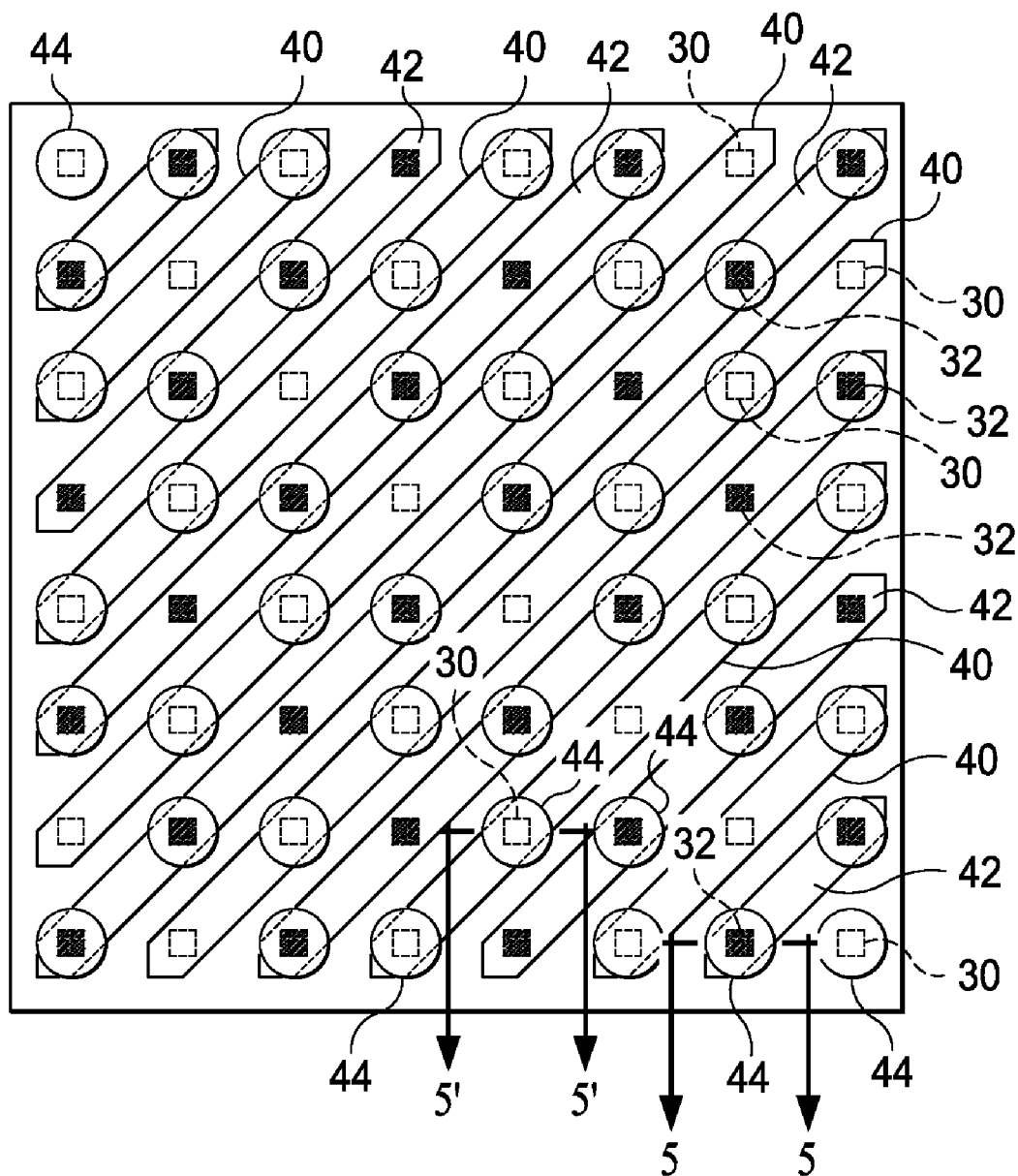
FIG. 4 illustrates a backside view of the chip, wherein redistribution lines are added to the structure as shown in FIG. 3.

FIGS. 3A and 3B only illustrate TSVs 30 and 32. In FIG. 4, backside redistribution lines (RDL) 40 and 42 are also illustrated. FIG. 4 is also the backside view of chip 100. RDLs 40 interconnect TSVs 30, while RDLs 42 interconnect TSVs 32. Bumps 44 are electrically connected to RDLs 40/42 and TSVs 30/32, and are connected to external interfaces.

Figure 5:
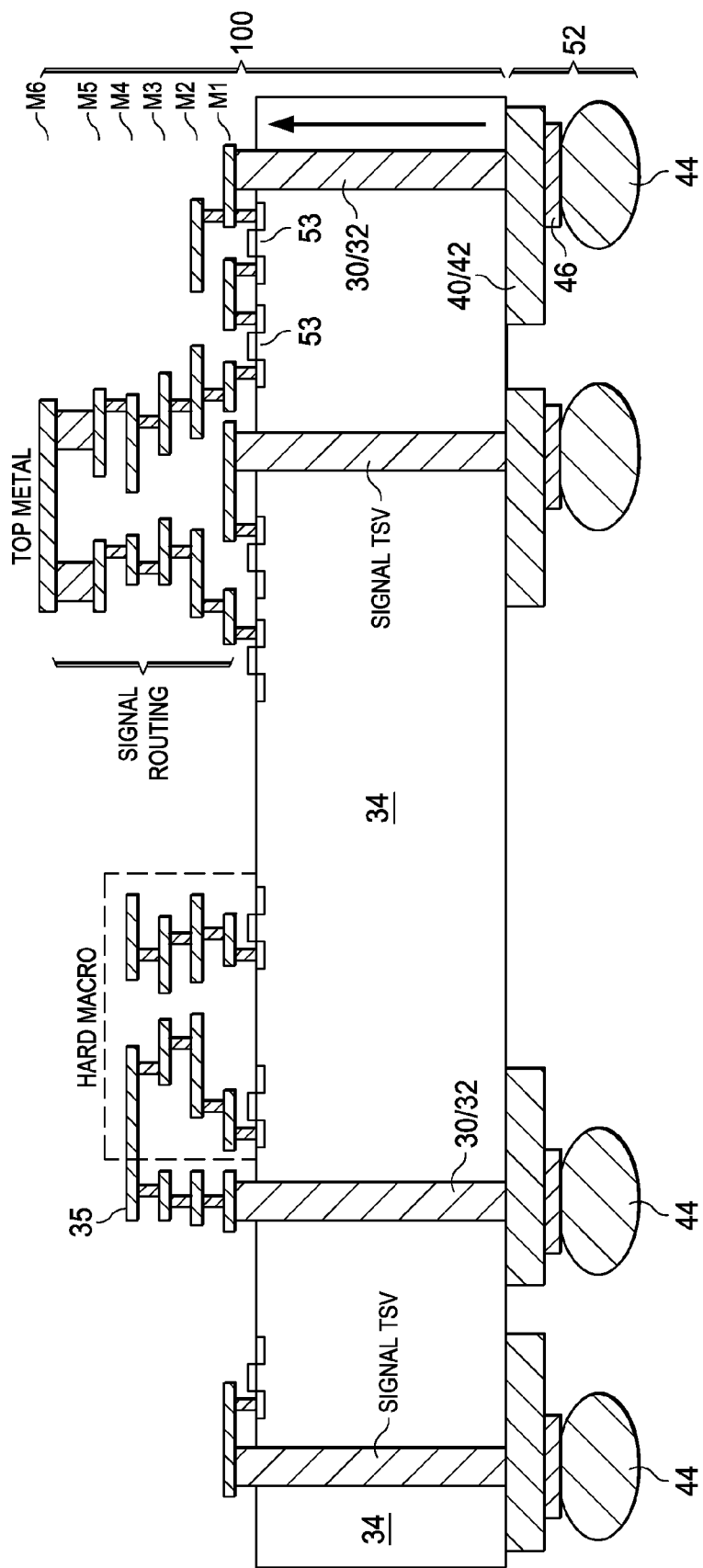
FIG. 5 illustrates a cross-sectional view of the structure as shown in FIG. 3.

FIG. 5 illustrates a cross-sectional view of the structure as shown in FIG. 4, wherein the cross-sectional views are made in a plane crossing either line 5-5 or line 5'-5' in FIG. 4. It is noted that TSVs 30/32 are in chip 100, while RDLs 40/42, under-bump metallurgy (UBM) 46, and bumps 44 are in package 52. TSVs 30/32 are connected to, and may physically contact and terminate at, the bottom metallization layer (commonly known as M1). TSVs 30/32 may sometimes be electrically coupled to the metal features in the metallization layer immediately over M1 (commonly known as M2). In metallization layers M1 and M2, the metal lines may only be used for local connections (refer to metal lines 60 and 62 in FIG. 8) that connect the power from the TSVs to surrounding integrated circuit devices, such as transistors 53. The power routing (the electrical connection to TSVs 30/32) may or may not be routed to metallization layer M3, and there will be very few power routings, if any at all, in M3. Accordingly, the power routing is substantially limited to lower metallization layers.

In an embodiment, no power routing is made to the top metallization layer (Top Metal), or to the pad layer (not shown) in which bonding pads (not shown), which are exposed to the top surface of chip 100) are formed. As a comparison, although the signal TSVs as shown in FIG. 5 can also be connected to the backside of chip 100, the signal TSVs may also be electrically connected to the top metal, and to the metal pads exposed to the top surface of chip 100. Since TSVs 30/32 are directly connected to metallization layer M1, instead of through multiple metal lines and vias ranging from the top surface of chip 100 down to metallization layer M1, the power routing will not adversely block the signal routing. Also, no power pads need to be formed on the top surface of chip 100.

If a macro (in FIG. 5, also refer to FIGS. 6A and 6B, also referred to as a hard macro) is placed and blocks all lower metal routing (M1 & M2), no TSV can be formed in the hard macro region, and power TSVs 30/32 have to be formed adjacent to the hard macro. Accordingly, additional metal layers (please refer to metal line 35) with stacked vias may be used to connect the circuits in the macro with TSVs 30/32 as shown in FIG. 5.

Figure 6A:
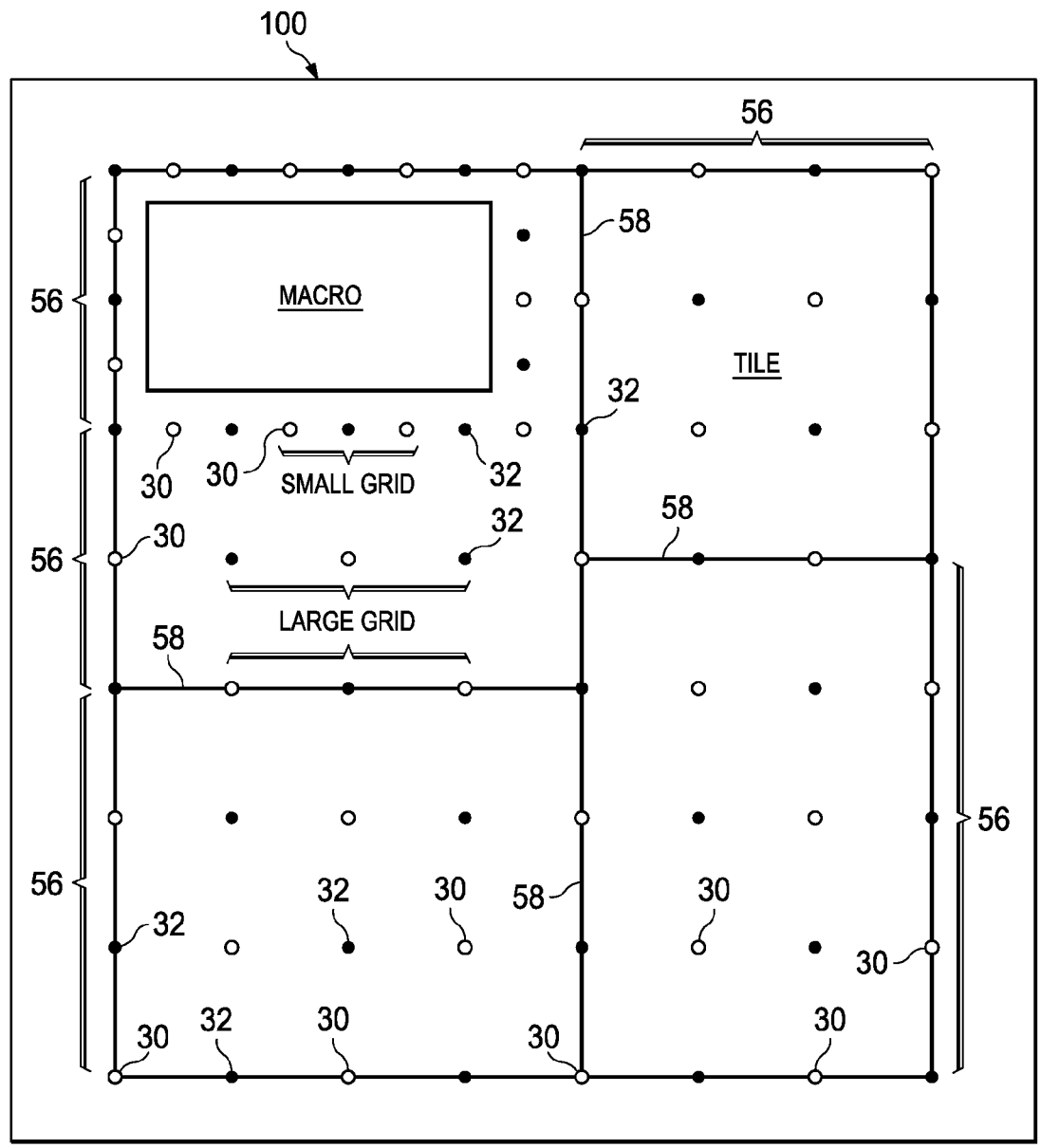
FIGS. 6A through 7 illustrate power supplying schemes for chips comprising more than one functional block.

In an embodiment, as illustrated in FIG. 3A, TSVs 30 and TSVs 32 are distributed uniformly throughout the entirety of chip 100. It is also realized that chip 100 may include different functional blocks, such as a controller, arithmetic logic unit (ALU), memories, and the like, and the functional blocks may have different requirements to the power supply. FIG. 6A illustrates an embodiment in which chip 100 is divided into sub regions (also referred to as tiles) 56. In this embodiment, different sub regions may have different densities of TSVs 30/32. For example, in one sub region, TSVs 30/32 may be placed on the maximum grid nodes (denoted to as "large grid" in FIG. 6A), while in other sub regions, TSVs 30/32 may be added to finer grids in addition to the ones placed on the maximum grid nodes (please refer to "small grid" in FIG. 6A). Further, for those functional blocks requiring greater currents, such as a memory macro (shown as the "Macro" in FIG. 6A), more TSVs 30/32 may be added. In an embodiment, the added TSVs 30/32 may be allocated around the macro in order to reduce the current carried by each of TSVs 30/32, so that the electro-migration in TSVs 30/32 may be reduced.

Figure 6B:
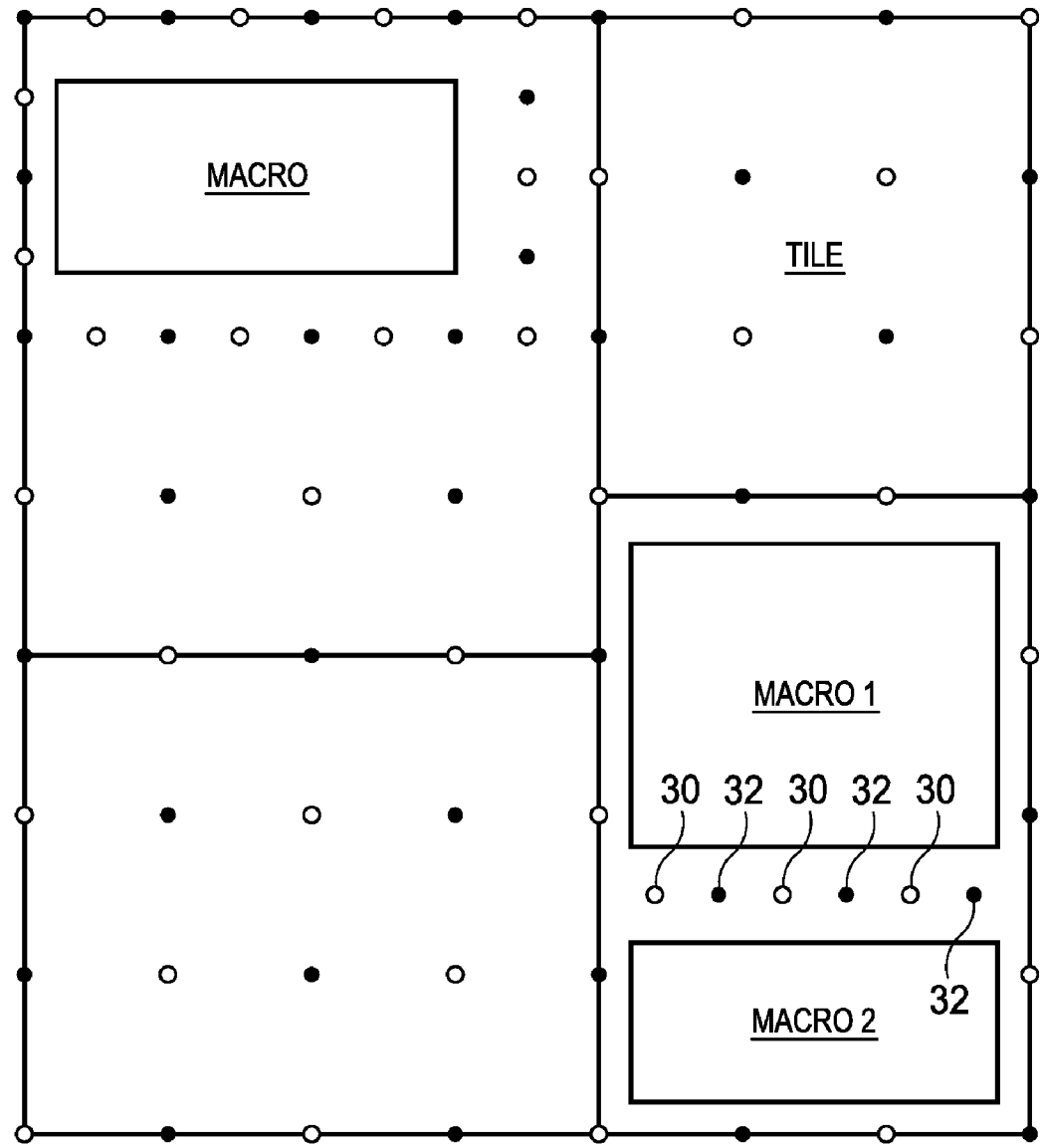

FIG. 6B illustrates off-grid placement of TSVs 30/32. For example, when Macros 1 and 2 are adjacent to each other, TSVs 30/32 may need to be placed between them. However, TSVs 30/32 may not be on the grid nodes of any large or small grids. Accordingly, TSVs 30/32 are off-grid TSVs.

Figure 7:
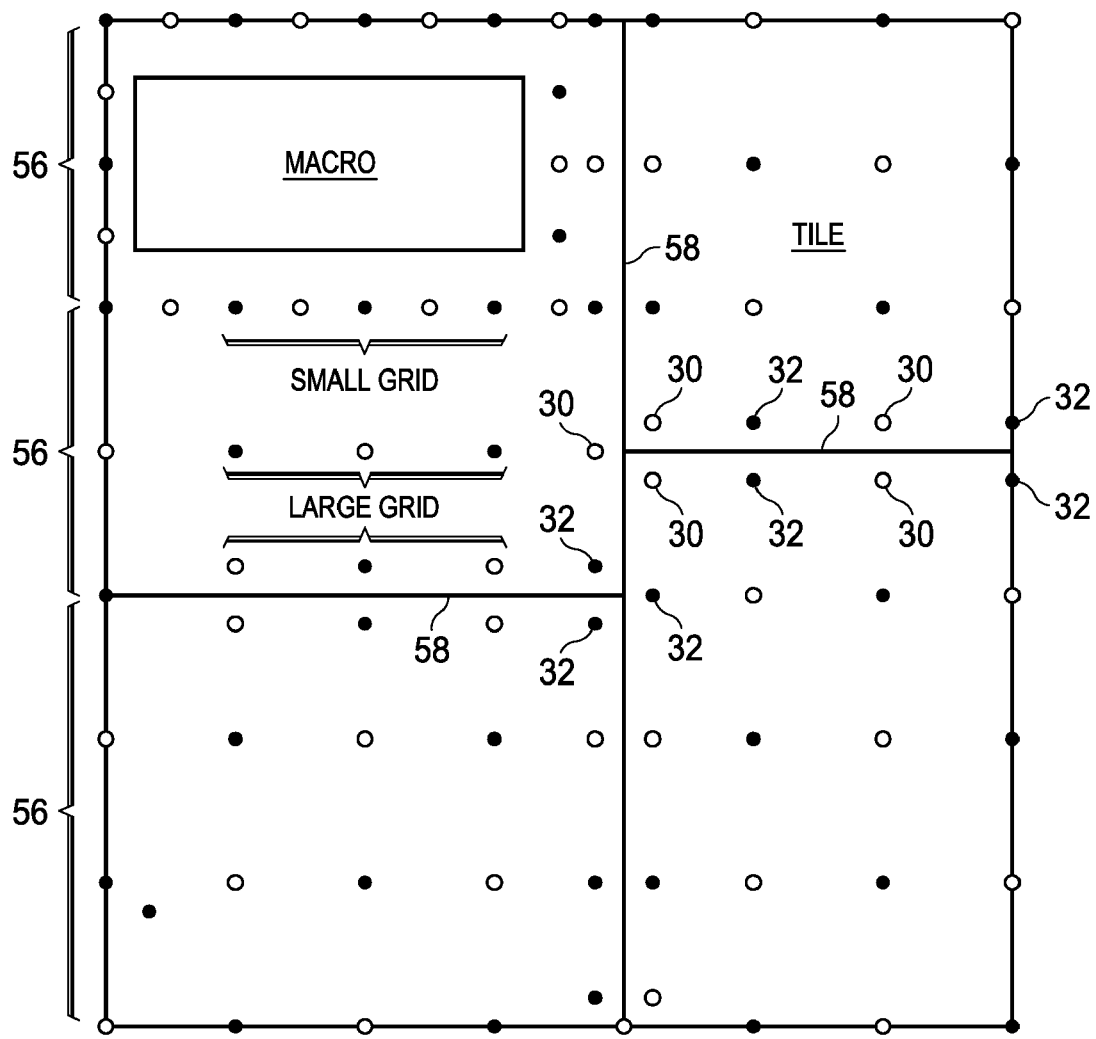

If neighboring sub regions 56 and the respective function blocks require a same power supply voltages VDD (and/or VSS), TSVs 30/32 may be placed on boundaries 58 between sub regions 56, so that TSVs 30/32 can be shared by neighboring functional blocks 56. In alternative embodiments, as shown in FIG. 7, neighboring functional blocks 56 may require different power supply voltages. For example, one functional block may require its operation voltage to be different from its neighboring functional block(s). Accordingly, TSVs 30/32 may be placed on opposite sides of, but not on, boundaries 58 between the corresponding sub regions 56. Accordingly, voltage islands may be formed, with one voltage island having a different operation voltage VDD/VSS than the respective operation voltage of its neighboring functional blocks.

Figure 8:
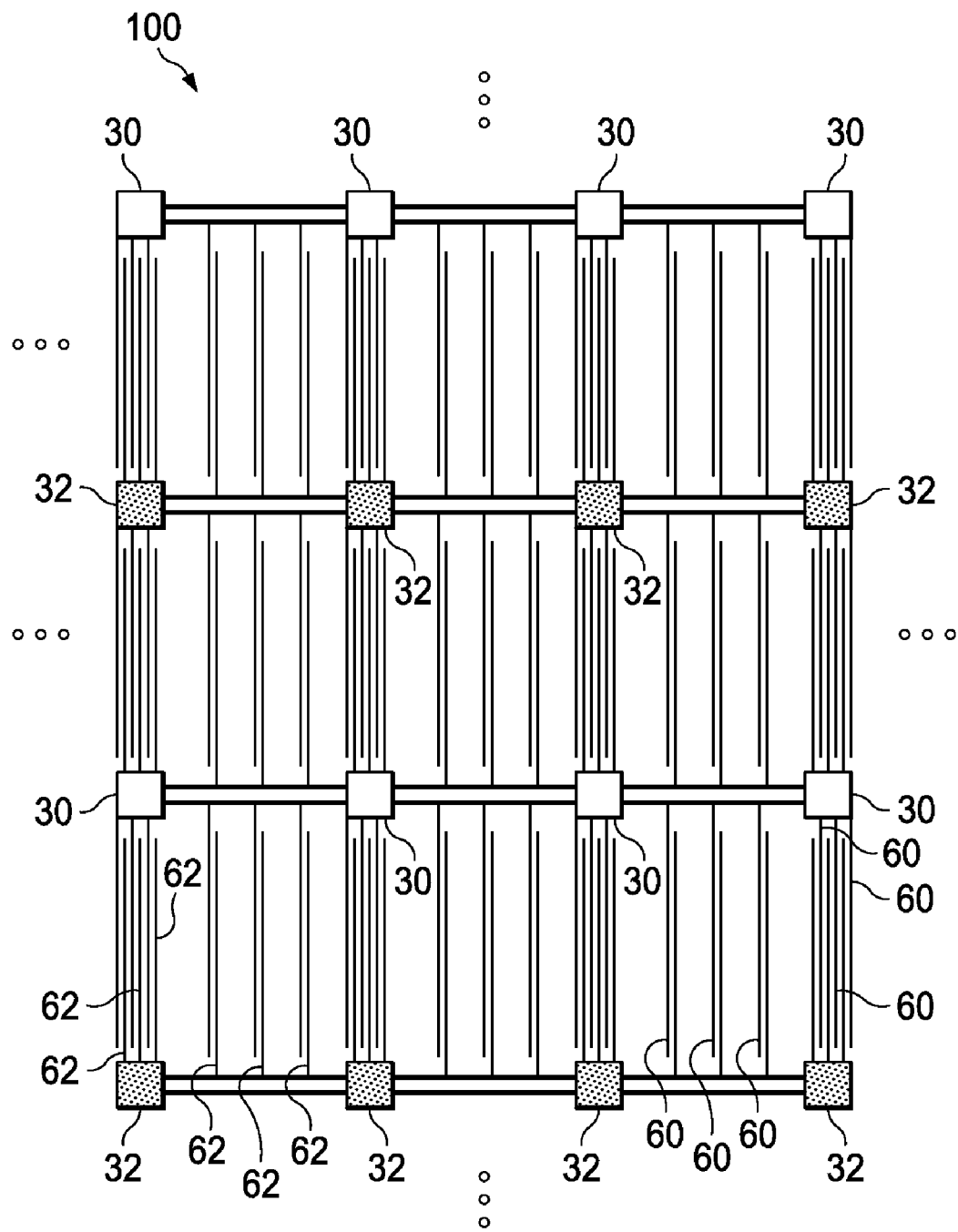
FIG. 8 illustrates how the power conducted by power TSVs is distributed locally.

FIG. 8 illustrates how operation voltages VDD and VSS are routed to the regions between TSVs 30/32. TSVs 30/32 and the metal lines connected to TSVs 30/32 are illustrated. Metal lines 60 are connected to TSVs 30, and hence also carry operation voltage VDD. Metal lines 62 are connected to TSVs 32, and hence also carries operation voltage VSS. Metal lines 60 and 62 may be located in metallization layer M1 (refer to FIG. 5). Further, additional metal lines (not shown) may be formed in metallization layer M2, wherein the additional metal lines in metallization layer M2 may be perpendicular to metal lines 60 and 62 in metallization layer M1. It is noted that FIG. 8 illustrates the horizontal placement of TSVs 30 and 32. One skilled in the art will realize how to route metal lines in metallization layers M1 and M2 for the vertical placement, the diagonal placement, or the like, of TSVs 30 and 32.

Figure 9:
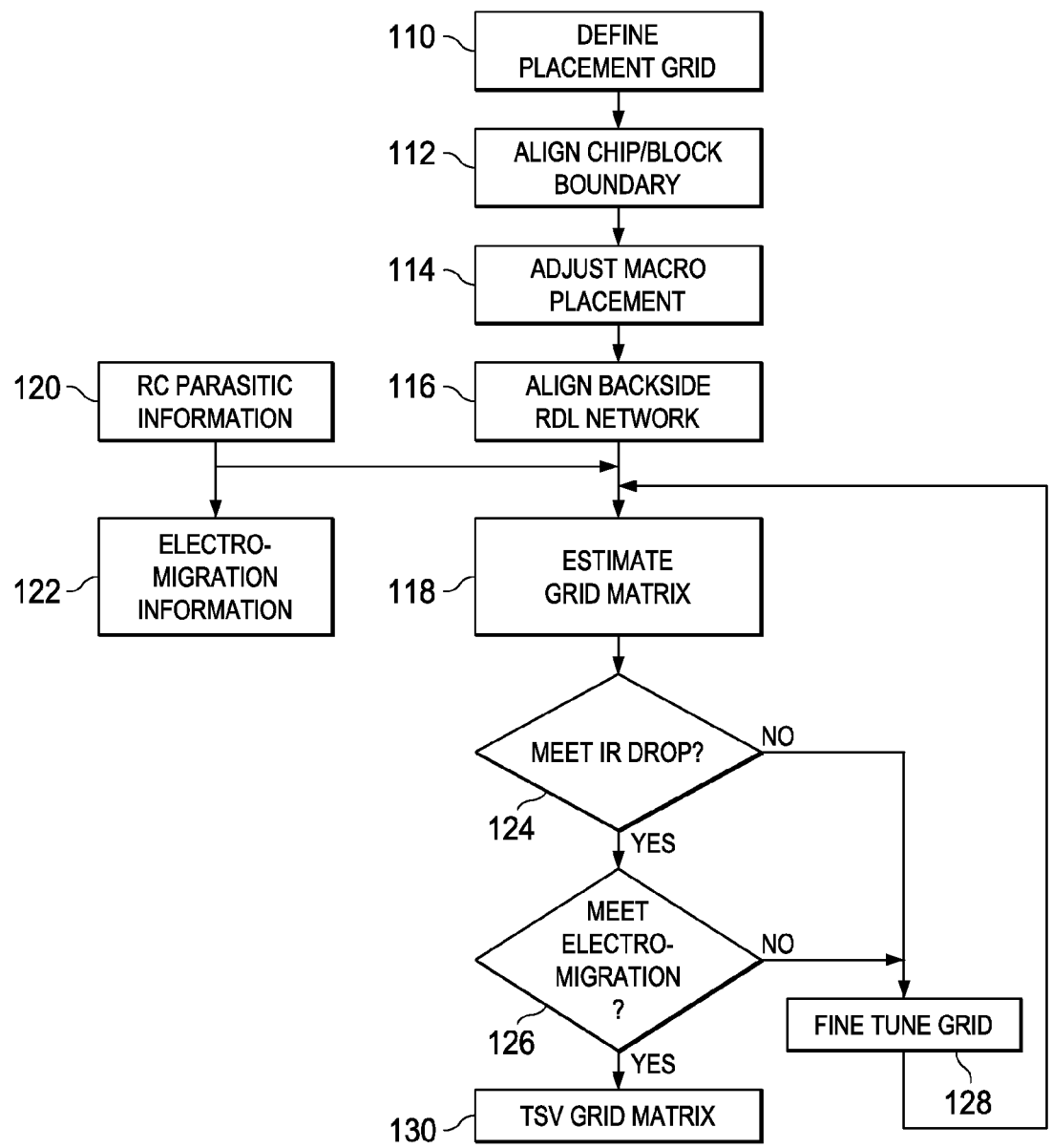
FIG. 9 illustrates a flow chart of a process for designing a power grid comprising TSVs.

FIG. 9 illustrates a flow chart of a process for designing a power grid using TSVs. As shown in step 110, the grids that can possibly be used for placing TSVs 30 and 32 (refer to FIG. 3) are first determined, wherein the grids may include a maximum grid and finer grids smaller than the maximum grid. The appropriate size of the maximum grid and the finer grids may be determined based on the circuits in the respective chip. TSVs 30 and 32 (refer to FIGS. 3A, 3B, 6A, 6B, and 7) may be placed on the maximum grid, although they can also be placed on the finer grids. Next, in step 112, the boundary of the chip is determined, the sub regions (FIGS. 6 and 7) of the respective chip for placing functional blocks are determined, and the boundaries of the sub regions are determined. The functional blocks are placed only within the respective sub regions.

Next (step 114), if the chip includes macros, such as memory macros, the sub regions for the macros are determined. Further, the power requirements of the macros are estimated, so that an appropriate amount of TSVs is calculated for the macros. The TSVs are then added onto the grids determined in step 110. The additional TSVs may be added to the finer grids since the grid nodes of the maximum grid may have already been placed with TSVs 30/32.

Referring to step 116, the backside RDL network (refer to RDLs 40 and 42 in FIGS. 4 and 5) is designed to align with the positions of TSVs 30 and 32. RDLs 40 and 42 interconnect TSVs 30 and 32, respectively. Next, the grid of TSVs 30 and 32 are estimated (step 118). The estimation includes the evaluation of parasitic information (step 120), such as parasitic capacitance, to see whether the design specification can be met (step 124). In addition, the currents flowing through TSVs 30 and 32 are estimated (step 122), so that the electro-migration in TSVs 30 and 32 can be evaluated. If the electro-migration is greater than what is defined by the specification (step 126), the power grid needs to be fine-tuned (step 128), for example, by adding more TSVs 30/32 to share currents with those TSVs 30/32 carrying high currents.

Further, with the currents in TSVs 30/32 and the metal lines in metallization layers M1 and M2 known (refer to FIG. 5), the voltage drop caused by current-resistance (IR) in the power routing paths can be estimated to find out whether the specification is met. If the specification is not met, more fine-tuning (step 128) is performed, for example, by adding more TSVs 30/32 to share currents with those TSVs 30/32 (or metal lines) carrying high currents, and/or widening those metal lines 60 and 62 (refer to FIG. 8) having high resistances. The steps between grid estimation (step 118) and fine-tuning (step 128) will be repeated until eventually, the IR drop and the electro-migration of the power routes meet the specification (step 130).

Figure 10:
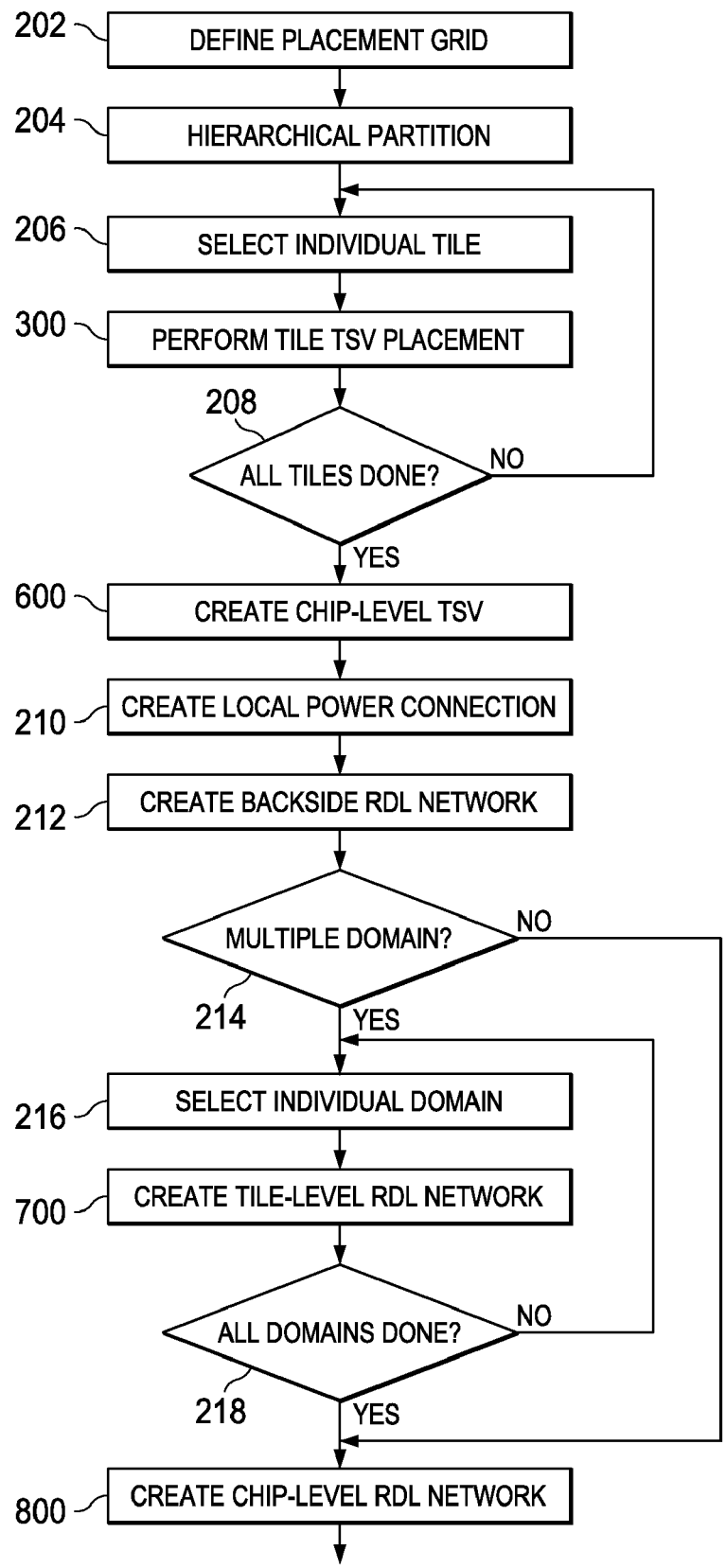

FIG. 10 illustrates a flow chart of the TSV placement process, in which the power TSVs are placed on a chip. In the art of placement and routing, TSVs are also referred to as "TSV pads." It is noted that the steps shown in FIG. 10 may be performed to the layouts of the chip. Throughout the description, since at the time the power TSVs are placed, the physical circuit has not been made yet, and the placement is performed on the layouts, the layouts are referred to as an integrated circuit representation. The subsequently discussed power TSV placement is started from a chip representation (also denoted as 100) and a substrate representation, since they are not a physical chip and a physical substrate. The power TSVs are added to the chip representation. After the formation of the layouts, which comprise the placed power TSVs, the layouts are stored in a storage media, which may be a hard drive of a computer, a tape, a disk, or the like. Further, the steps shown in FIG. 10 and the related flow charts as shown in FIGS. 14-19 may be performed by a computer. The layouts may be implemented on semiconductor chips. Accordingly, the layouts also represent the physical chip structure. In subsequent paragraphs, a chip representation is alternatively referred to as a chip.

Referring to FIG. 10, first, placement grids (step 202) are made on the chip representation. The placement grids may include the maximum grid and finer grids, as discussed in preceding paragraphs. For example, in FIGS. 12 and 13, the grid on which power TSVs 30_1, 32_1, 30_2, and 32_2 are placed is a maximum grid, while the grid on which power TSVs 30_4 and 32_4 are placed is a finer grid.

Figure 11:
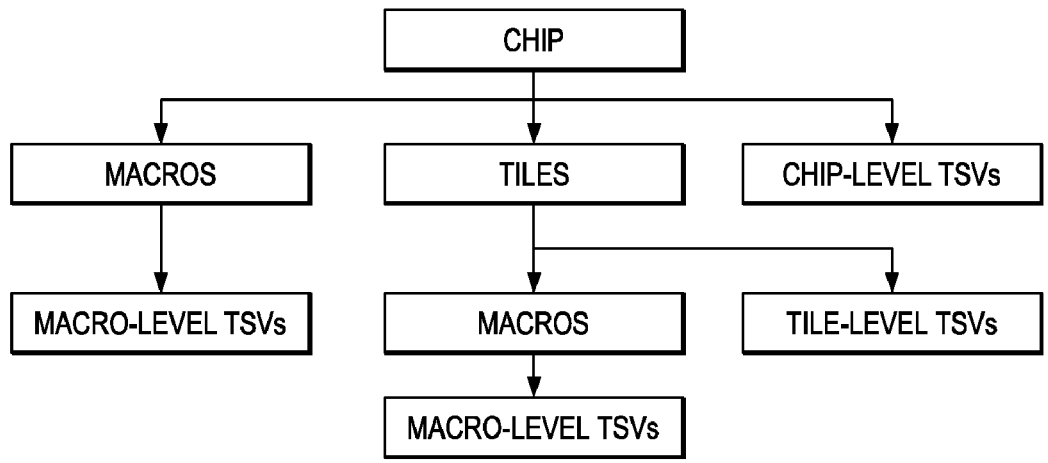
FIG. 11 illustrates the partitions in a chip representation and respective power TSVs.
Figure 12:
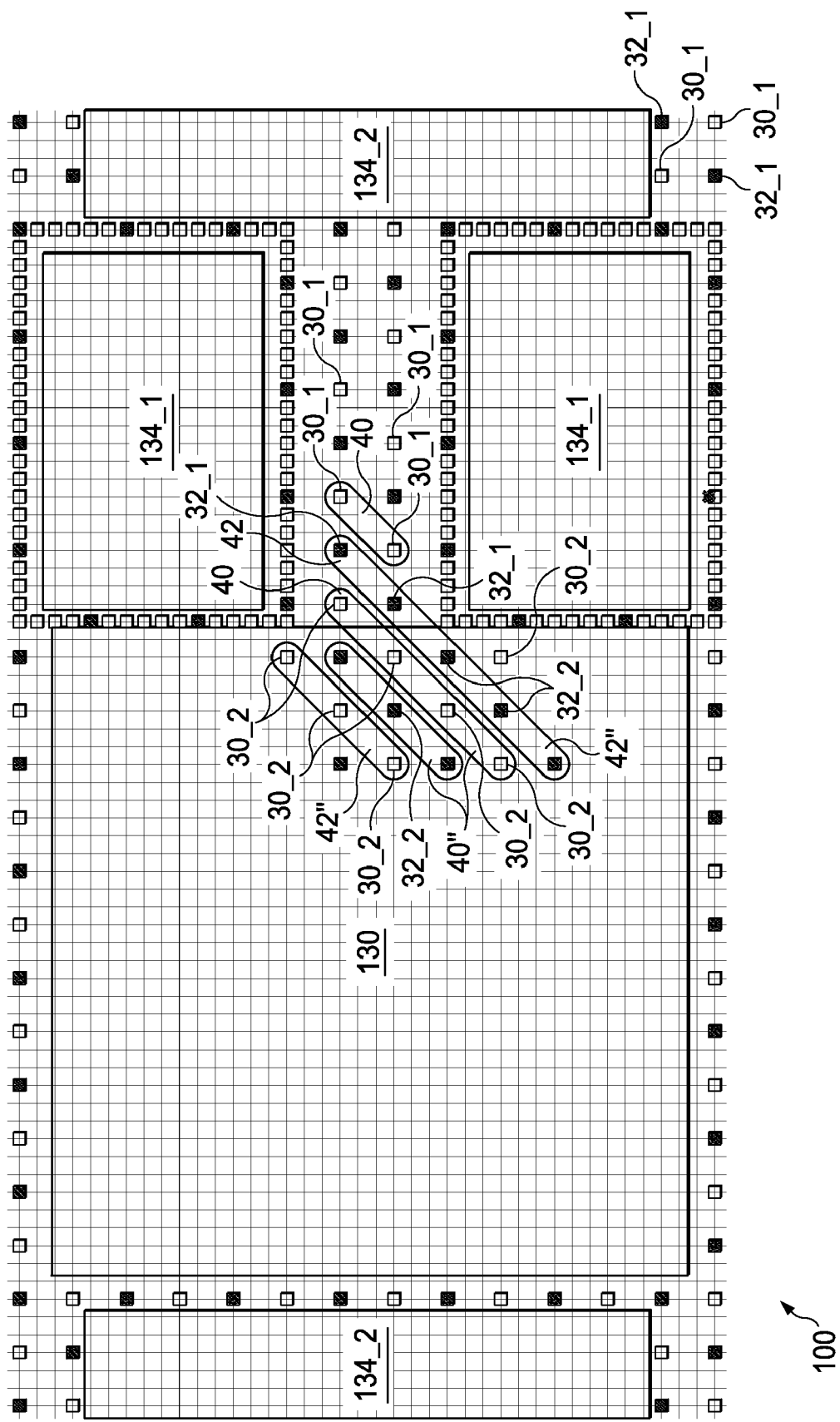
FIG. 12 schematically illustrates a chip representation including a tile and a plurality of macros.
Figure 13:
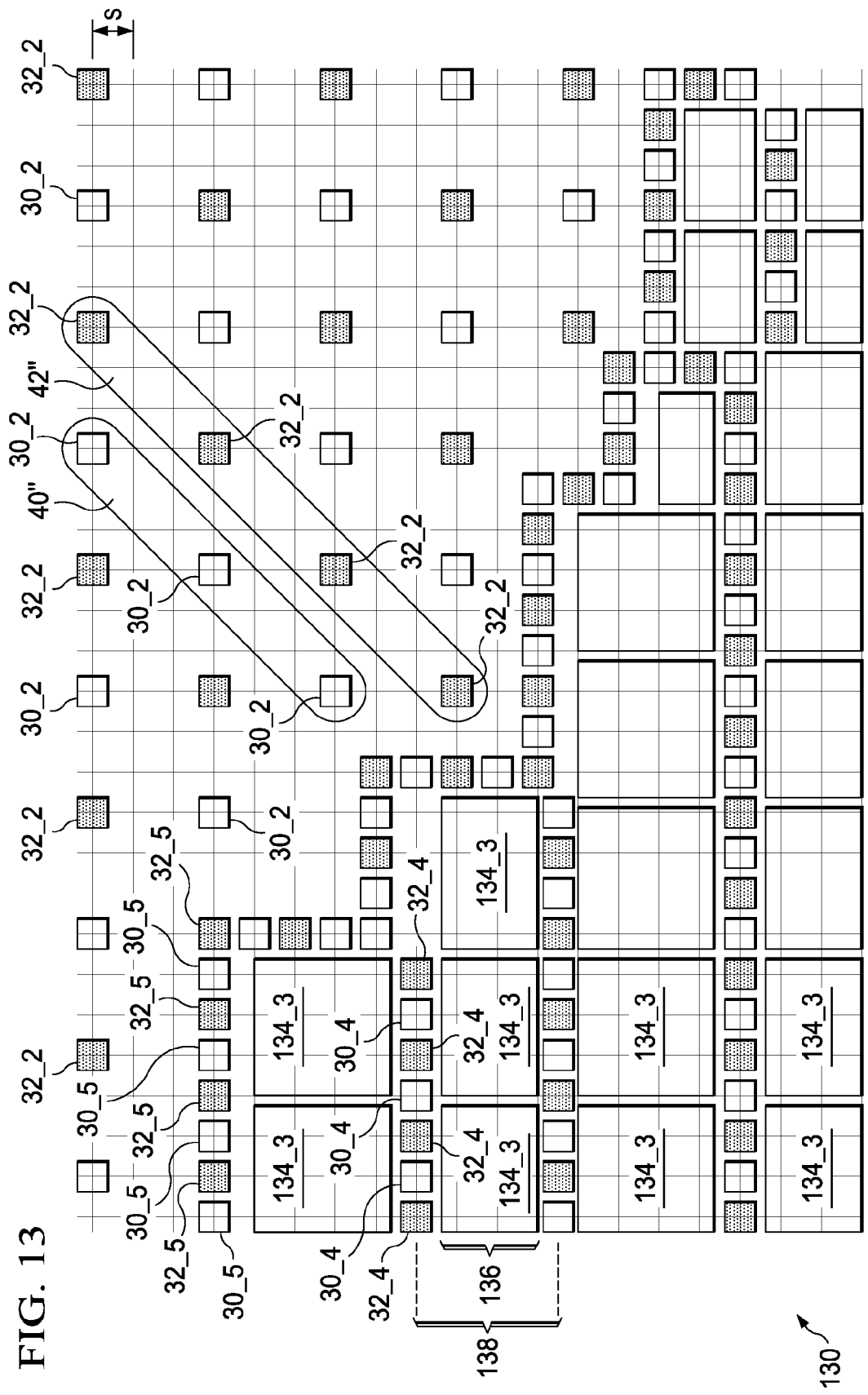
FIG. 13 illustrates a tile and the macros inside the tile.

Next, as shown in step 204, a whole chip is partitioned into a chip level, a tile level, and a macro level. Referring to FIG. 11, a chip may include one or more tiles, wherein the tiles are defined according to functions. For example, in FIG. 12, chip 100 includes tile 130. One tile may include one or more macros, wherein the macros are blocks on a chip, in which blocks no power TSVs can be placed. Chip-level power TSVs, tile-level power TSVs, and macro-level power TSVs are also illustrated. FIG. 13 illustrates an exemplary tile 130, which includes macros 134_3. Further, as shown in FIG. 11, a chip may include one or more macros that are directly under chip level, but are not in tiles. FIG. 12 illustrates exemplary chip-level macros 134_1, which are memory macros, and chip-level macros 134_2, which are input/output (JO) macros. The partition of a whole chip makes the placement of TSVs less complicated. FIG. 11 illustrates that each of the chip level, the tile level, and the macro level may include power TSVs, which are referred to as chip-level TSVs, tile-level TSVs, and the macro-level TSVs, respectively.

Figure 14:
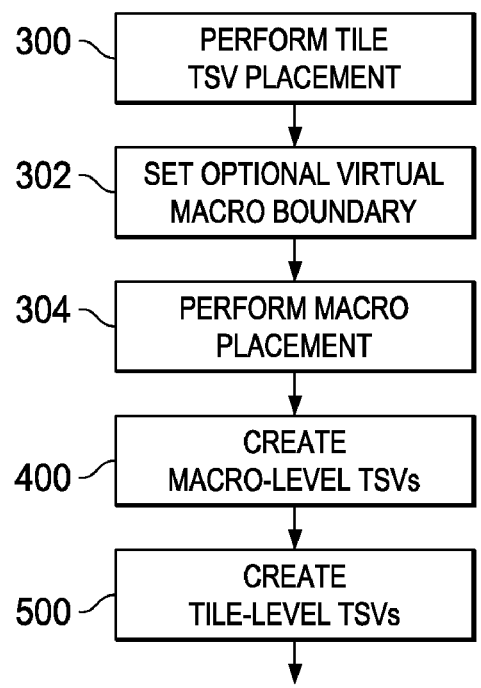

Referring back to FIG. 10, steps 206, 300, and 208 define how tile-level TSVs and macro-level TSVs are placed. Generally, all the tiles in the chip are processed one by one (step 206), until all of the tiles in the chip are processed (step 208). Power TSVs are placed in each of the tiles (step 300). The details for performing the tile-level placement are illustrated in FIG. 14, and will be discussed in detail in subsequent paragraphs.

Figure 17:
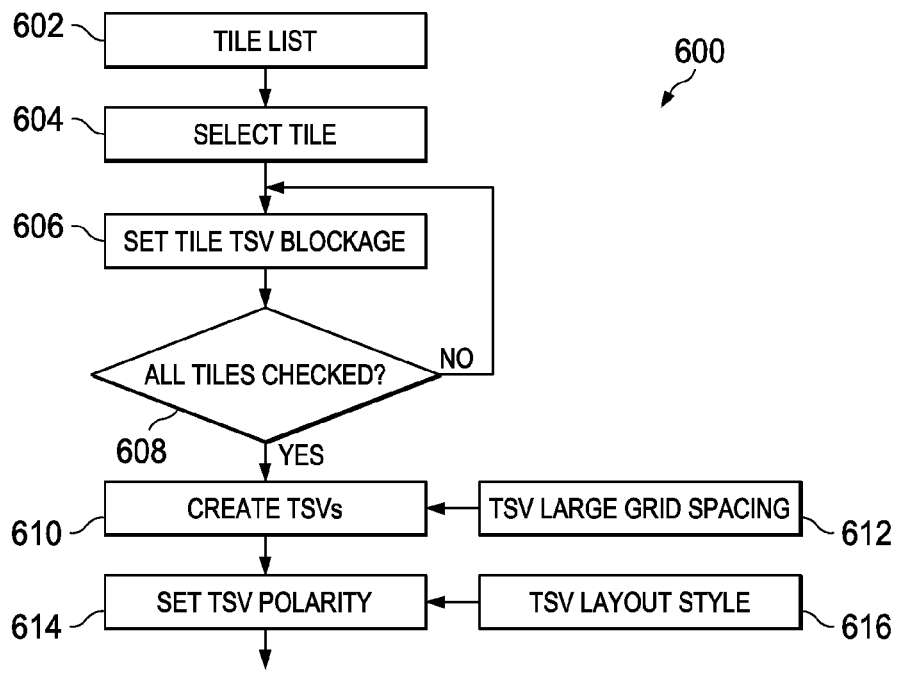

Next, in step 600, chip-level TSVs are placed in the remaining chip area in which no macro-level and tile-level TSVs are placed. The details for placing the chip-level TSVs are shown in FIG. 17. Step 210 illustrates the creation of the local power connection, which is also shown in FIG. 8 and discussed in preceding paragraphs.

Next, backside RDL networks are created (step 212, also refer to FIG. 4). The backside RDL network creation includes steps 214, 216, 700, 218, and 800. It is realized that VDD TSVs in one power domain cannot be connected to VDD TSVs in another power domain having a different VDD voltage. Each power domain may have one VDD voltage and one VSS voltage, and different power domains may (or may not) have different VDD voltages and/or VSS voltages. Each tile may belong to a power domain. The chip-level TSVs may also belong to a power domain, or be treated as not belonging to any power domain. The power domain in one or more tile may be combined with the power domain of the TSVs at the chip-level.

Referring to step 214, the multiple domains in a chip, if any, are defined. For each of the power domains (step 216), an RDL network will be created. The details of the RDL networks may be found in FIGS. 4 and 5, which were discussed in preceding paragraphs. The RDL networks are created for each power domain in the chip, until all power domains have been processed (step 218). In step 800, the chip-level TSVs that do not belong to any of the power domains may be processed, and the corresponding RDL network is created. Alternatively, in the embodiment that the chip-level TSVs belong to one of the power domains, the RDL network for the chip-level TSV would have already been formed in steps 214, 216, 700 (see FIG. 18), and 218. Accordingly, step 800 can be skipped. If the chip only includes one power domain, steps 216, 700, and 218 may be skipped.

FIG. 14 illustrates the flow chart of the tile-level placement, and shows the details of step 300 in FIG. 10. FIG. 14 illustrates the placement of power TSVs in one tile, while the TSV placement for all tiles is shown in the loop including steps 206, 300, and 208 in FIG. 10. It is noted that when macros are placed close to each other, inter-block TSVs may need to be placed between macros. Referring to FIG. 13, TSVs 30_4 and 32_4 are placed between macros 134_3. To ensure that there is enough space to place TSVs 30_4 and 32_4 between macros 134_3, the chip areas (for example, marked as 136) occupied by macros are enlarged to all directions to form extended macros (also referred to as virtual macros, step 302 in FIG. 14). In each direction, the respective boundary is extended outward by at least one-half of a fine grid space S, and the chip areas of the virtual macros are extended to 138 as shown in FIG. 13. The enlargement amount in each direction may also be one fine grid space S, 1.5 S, 2 S, and so on. With neighboring macros being enlarged by at least 0.5 S, the neighboring virtual macros, when placed side joining side, will result in space S between neighboring macros 134_3, which is enough for placing inter-block TSVs 30_4 and 32_4. Step 304 in FIG. 14 illustrates the placement of macros. After the placement of macros, power TSVs can be placed. Steps 400 and 500 are related to the macro-level TSV placement and tile-level TSV placement, respectively. The details are shown in FIGS. 15 and 16, respectively.

Figure 15:
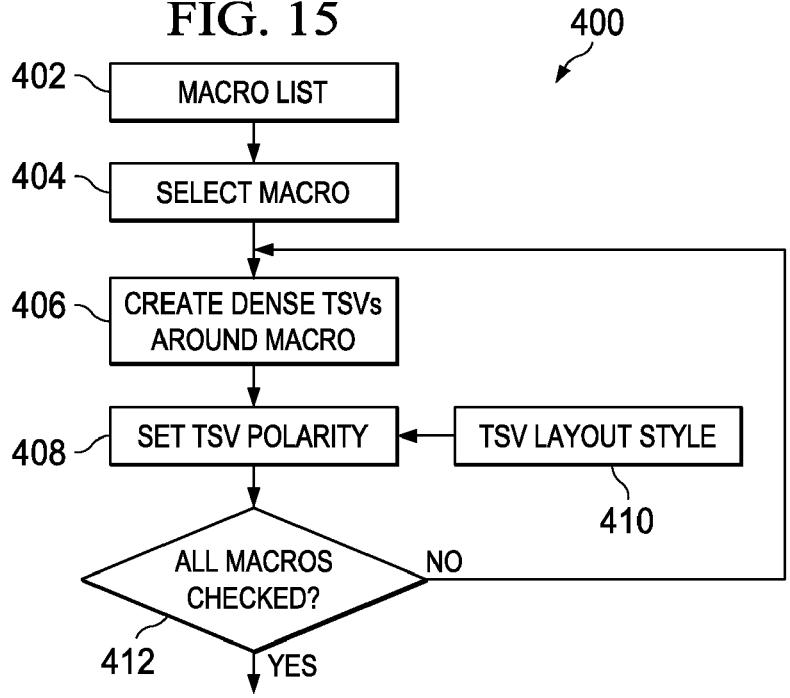
Figure 16:
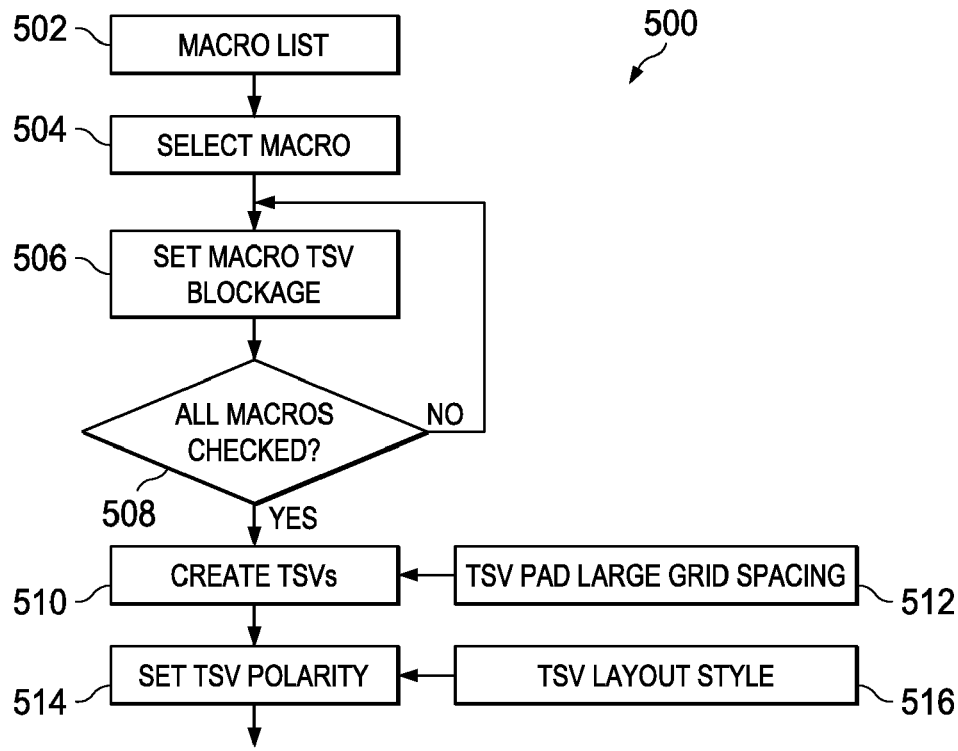

FIG. 15 illustrates the placement of macro-level TSVs in one tile. First, all macros in the tile are retrieved to form a macro list (step 402). Each of the macros is then selected (step 404) and processed (steps 406-410). In step 406, macro-level TSVs are placed around each of the macros. For example, in FIG. 13, macro-level TSVs 30_4/32_4 and 30_5/32_5 are formed. Macro-level TSVs 30_4/32_4 are inter-block TSVs, while macro-level TSVs 30_5/32_5 are not inter-block TSVs. Macro-level TSVs 30_4/32_4 and 30_5/32_5 are typically placed on grid nodes of finer grids, and hence are referred to as dense TSVs. At the time of placing, whether a power TSV will be a VDD TSV or a VSS TSV has not been determined. Accordingly, an additional step 408 may be performed to designate the polarity (VDD TSV or VSS TSV) of each of macro-level TSVs 30_4/32_4 and 30_5/32_5. Further, the designation of the polarity of the TSVs also needs to take into consideration the style (patterns) of the TSVs, such as whether they will be horizontal, vertical, diagonal, or zigzagged, as has been discussed in preceding paragraphs. The placement is performed for each of the macros (step 412).

After macro-level TSVs inside the tile have been placed, the remaining chip area inside the tile also needs to be placed with tile-level TSVs, as shown in step 500 in FIG. 14. The detail of step 500 is shown in FIG. 16. Referring to FIG. 16, all macros in the tile are retrieved to form a macro list (step 502). Each of the macros is then selected one by one (step 504) and processed (steps 506 and 508). The chip areas occupied by macros inside the tile cannot be placed with power TSVs. The surrounding chip area has already been placed with dense macro-level TSVs (as shown in FIG. 15), and hence also cannot be placed with TSVs. Therefore, macro TSV blockage needs to be set to indicate that these chip areas cannot be placed with tile-level TSVs (step 506), while remaining chip area of the tile can be placed with tile-level TSVs. The blockage needs to be set for all macros in the tile, such as 134_3 in FIG. 13. Accordingly, the tile-level TSVs (shown as TSVs 30_2 and 32_2 in FIG. 13) are placed (step 510), for example, on the maximum grid (step 512). Next, the polarity and the style (pattern) of the tile-level TSVs are set (steps 514 and 516), similar to steps 408 and 410 in FIG. 15.

After tile-level TSVs inside each of the tiles have been placed, the remaining chip area outside the tiles also needs to be placed with chip-level TSVs, as shown in step 600 in FIG. 10. The detail of step 600 is shown in FIG. 17. First, all tiles in the chip are retrieved to form a tile list (step 602). Each of the tiles is then selected (step 604) and processed (steps 606 and 608). The chip areas occupied by the tiles cannot be placed with TSVs. The macros are directly under chip level but not in tiles, and the surrounding chip areas also cannot be placed with TSVs. Therefore, TSV blockage needs to be set to indicate that these chip areas cannot be placed with chip-level TSVs (step 606), while remaining chip areas can be placed with chip-level TSVs. For example, in FIG. 12, the blockage needs to be set for all macros 134_1 and 134_2, and tile 130 (step 608). Accordingly, the chip-level TSVs (shown as TSVs 30_1 and 32_1 in FIG. 12) are placed (step 610), for example, on the maximum grid (step 612) in the rest of the chip area. It is preferred that the chip-level TSVs 30_1 and 32_1 are aligned to tile-level TSVs 30_2 and 32_2, wherein the alignment is shown using the example in FIG. 12. Next, the polarity and the style (pattern) of the chip-level TSVs are set (steps 614 and 616), similar to steps 408 and 410 as in FIG. 15.

Figure 18:
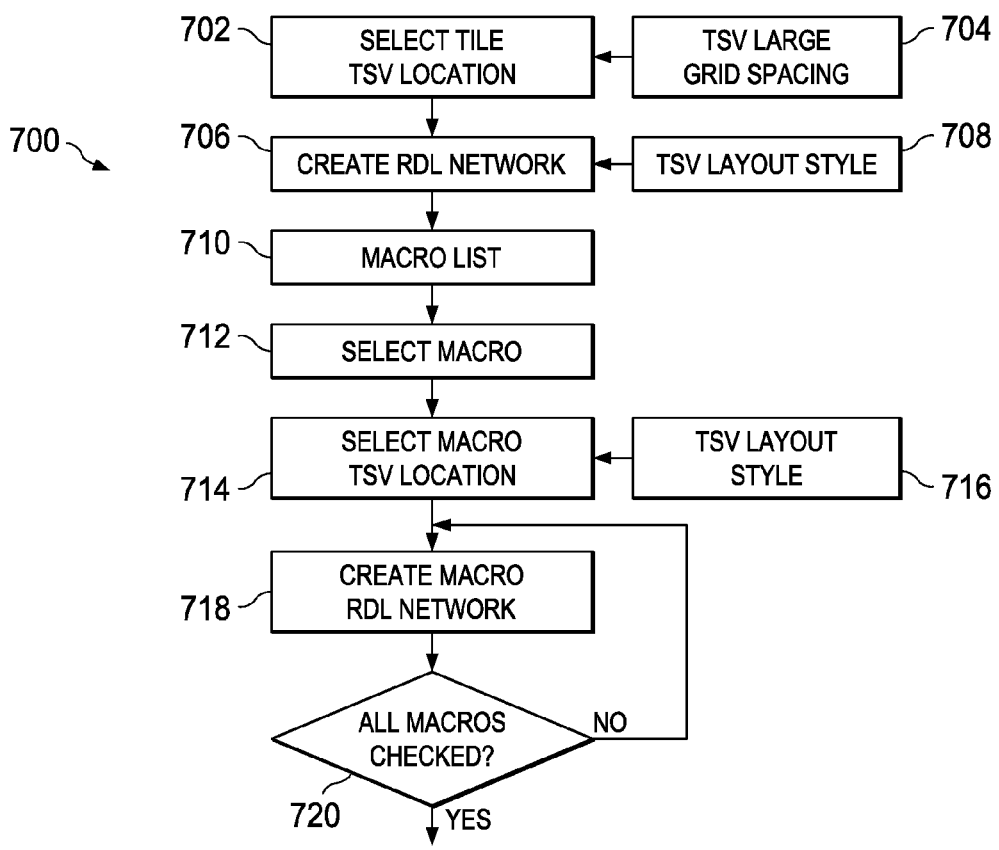

FIG. 18 illustrates the creation of a tile-level RDL network, wherein the flow represents the creation of the tile-level RDL network for one tile. The steps shown in FIG. 18 are also represented by step 700 in FIG. 10. Referring to FIG. 18, in steps 702 and 704, the locations and the spacing of tile-level TSVs are determined, and RDL networks are created (step 706), wherein an exemplary RDL network is shown in FIGS. 4 and 5. In the tile-level RDL network, VDD TSVs 30 are interconnected by RDLs 40", while VSS TSVs 32 are interconnected by RDLs 42" (refer to FIG. 13. For simplicity, only one RDL 40" and one RDL 42" are shown). The extending direction and connection style of RDLs 40" and 42" are related to the patterns (styles) of power TSVs 30/32 (step 708) in FIG. 18. For example, if power TSVs are horizontal, vertical, diagonal, or zigzagged, the respective RDLs 40 and 42 will also be horizontal, vertical, diagonal, or zigzagged, respectively.

Figure 20A:
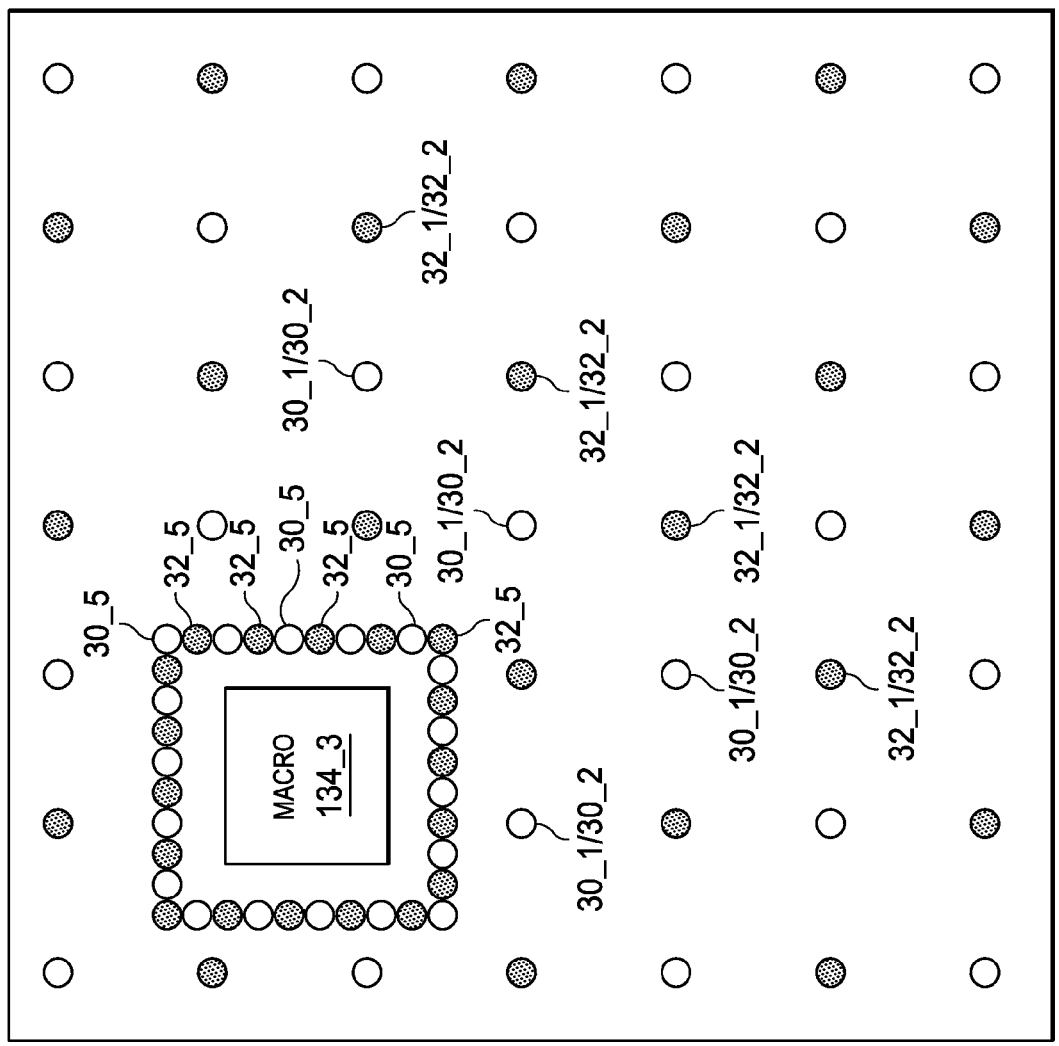
FIGS. 20A and 20B illustrate macro-level power TSVs surrounding a macro, and the respective redistribution lines.
Figure 20B:
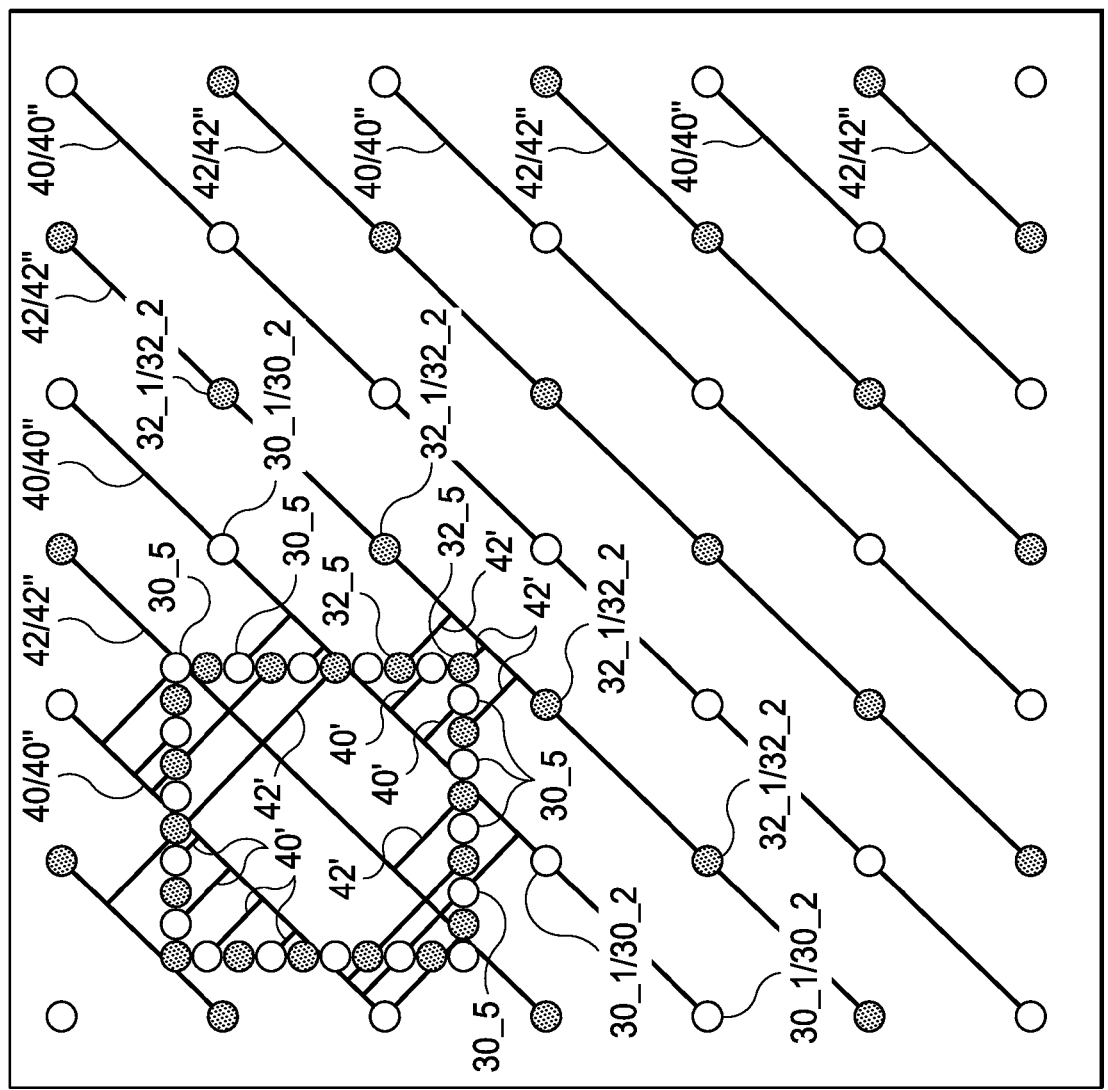

Steps 710 through 720 illustrate the connection of the above-created RDL network to macro-level TSVs. The respective connection is shown in FIGS. 20A and 20B. FIG. 20A illustrates a top view of chip 100, wherein macro 134_3 is shown, with macro-level TSVs 30_5 and 32_5 surrounding macro 134_3. FIG. 20B illustrates the backside of chip 100. If macro 134_3 is in a tile, the respective RDLs are tile-level RDLs 40" and 42". Otherwise, if macro 134_3 is not in a tile, the respective RDLs are chip-level RDLs 40 and 42. It is noted that besides RDLs 40/40" and 42/42", additional RDLs 40' and 42' are created (in step 718) to connect to TSVs 30_5 and 32_5, respectively, wherein the locations and styles of TSVs 30_5 and 32_5 are determined in steps 714 and 716 in FIG. 18, respectively. RDLs 40' are connected to RDLs 40/40", while RDLs 42' are connected to RDLs 42/42". Accordingly, power is routed to dense macro-level TSVs 30_5 and 32_5 through the RDL network.

FIG. 19 illustrates the creation of a chip-level RDL network. The steps shown in FIG. 19 are also represented by step 800 in FIG. 10. Referring to FIG. 19, in steps 802 and 804, the locations and the spacing of the chip-level TSVs are determined, and RDL networks are created (step 806). An exemplary chip-level RDL network is shown in FIG. 12, wherein the chip-level RDL network includes RDLs 40 and 42 outside all macros and all tiles in chip 100. In the RDL network, VDD TSVs 30 are interconnected by chip-level RDLs 40 (refer to FIG. 12), while VSS TSVs 32 are interconnected by chip-level RDLs 42. Again, the extending direction and connection style of RDLs 40 and 42 are determined by the patterns (styles) of TSVs 30/32 (step 808).

Steps 810 through 820 illustrate the connection of the above-created RDL network to tile-level TSVs. The respective connection is shown in FIG. 12. In the steps shown in FIG. 19, RDLs 40" and 42" in tile 130 have already been created. In steps 802 through 808, RDLs 40 and 42 outside all tiles and macros are also created. In steps 810 through 820, the RDLs 40 at the chip level may be connected to the tile-level RDLs 40", and the RDLs 42 at the chip level may be connected to the tile-level RDLs 42" in one or more of the tiles (130). Please note that the connection of chip-level TSVs to the tile-level TSVs can only be performed if they are in a same power domain. If they are not in the same power domain, they will not be connected.

The embodiments of the present invention have several advantageous features. In the TSV grid, the TSVs pads (for example, with sizes 6 μm×6 μm) replace large pad openings (for example, with sizes 30 μm×30 μm) on the front surface of chips. The pads can be placed as desirable within the core area without causing routing blockage issues. Accordingly, not only the pad-pitch restriction requirement is relaxed, but also significant chip size reduction is achieved. In addition, currents flow from low resistive TSVs directly to devices rather than distributed through multiple metal layers, resulting in less IR drop. The metal routing is substantially limited in lower metal layers, wherein only local power connection is involved. The overall routability is significantly improved. With the novel TSV grid matrix approach, both cycle time and yield are significantly improved. TSVs 30 and 32 have large coupling capacitance, and hence have the function of reducing coupling noises.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. An integrated circuit structure comprising:
a chip comprising a substrate; and
a power distribution network comprising:
    a plurality of power through-silicon vias (TSVs) penetrating the substrate, wherein the plurality of power TSVs forms a grid, and wherein the plurality of power TSVs comprises:
        a plurality of VDD TSVs electrically interconnected to each other; and
        a plurality of VSS TSVs electrically interconnected to each other and disconnected from the plurality of VDD TSVs, wherein the plurality of VDD TSVs and the plurality of VSS TSVs are allocated in an alternating pattern; and
    a plurality of metal lines, wherein the plurality of metal lines couples the plurality of power TSVs to integrated circuit devices on the substrate.

2. The integrated circuit structure of claim 1, wherein the plurality of power TSVs is distributed substantially uniformly throughout an entirety of the substrate.

3. The integrated circuit structure of claim 1, wherein throughout the chip, local power routing from the plurality of power TSVs to respective surrounding integrated circuit devices is substantially in a bottom metal layer (M1) and an immediate overlying layer (M2), and is not in metal layers over the M2.

4. The integrated circuit structure of claim 1, wherein the plurality of VDD TSVs is aligned along first parallel lines parallel to an edge of the chip with no VSS TSV in the first parallel lines, and the plurality of VSS TSVs is aligned along second parallel lines parallel to an edge of the chip with no VDD TSV in the second parallel lines.

5. The integrated circuit structure of claim 1, wherein the plurality of VDD TSVs is aligned along first parallel lines parallel to a diagonal direction of the chip with no VSS TSV in the first parallel lines, and the plurality of VSS TSVs is aligned along second parallel lines parallel to the first parallel lines with no VDD TSV in the second parallel lines.

6. The integrated circuit structure of claim 1, wherein the chip comprises a plurality metallization layers, and wherein substantially none of the plurality of power TSVs are electrically coupled to metal features in a top metallization layer among the plurality of the metallization layers.

7. The integrated circuit structure of claim 6, wherein electrical connections to the plurality of power TSVs are substantially limited in the M1 and a metallization layer (M2) immediately over the M1.

8. The integrated circuit structure of claim 1 further comprising:
a first plurality of redistribution lines (RDLs) on a backside of the chip, wherein each of the first plurality of RDLs electrically couples a portion of the plurality of VDD TSVs;
a first bump coupled to each of the first plurality of RDLs;
a second plurality of RDLs on the backside of the chip, wherein each of the second plurality of RDLs electrically couples a portion of the plurality of VSS TSVs; and
a second bump coupled to each of the second plurality of RDLs.

9. The integrated circuit structure of claim 1, wherein the chip comprise a plurality of sub regions each corresponding to one of functional blocks, and wherein the plurality of power TSVs comprises a portion in each of the functional blocks.

10. The integrated circuit structure of claim 9, wherein a portion of the power TSVs is located on boundaries of the sub regions.

11. The integrated circuit structure of claim 9, wherein the sub regions comprise a first sub region and a second sub region having a boundary, wherein the plurality of power TSVs comprises a first portion in the first sub region and close to the boundary, and a second portion in the second sub region and close to the boundary, and wherein none of the plurality power TSVs are located on the boundary.

12. The integrated circuit structure of claim 9, wherein the plurality of sub regions comprises a macro region, wherein the integrated circuit structure further comprises an additional plurality of power TSVs close to the macro region, and wherein the additional plurality of power TSVs comprises and additional plurality of VDD TSVs and an additional plurality of VSS TSVs.

13. The integrated circuit structure of claim 12, wherein the additional plurality of VDD TSVs forms a zigzag pattern, and the additional plurality of VSS TSVs forms a zigzag pattern.

14. The integrated circuit structure of claim 12, wherein no power TSV is formed in the macro region, wherein the integrated circuit structure further comprises metal connections in a third metallization layer (M3) two layers above the M1, and wherein the metal connections connect the additional plurality of power TSVs to circuits in the macro region.

15. The integrated circuit structure of claim 12, wherein the additional plurality of VDD TSVs and the additional plurality of VSS TSVs are off-grid TSVs.

16. An integrated circuit structure comprising:
a chip comprising a semiconductor substrate;
a first plurality of VDD through-silicon vias (TSVs) penetrating the semiconductor substrate;
a first plurality of VSS TSVs penetrating the semiconductor substrate, wherein the first plurality of VDD TSVs and the first plurality of VSS TSVs form a first grid, and are allocated in a substantially alternating pattern in each row and each column of the first grid;
a transistor on a front side of the semiconductor substrate;
a first plurality of redistribution lines (RDLs) on a backside of the semiconductor substrate opposite the front side, wherein each of the first plurality of RDLs electrically couples a portion of the first plurality of VDD TSVs; and
a second plurality of RDLs on the backside of the semiconductor substrate, wherein each of the second plurality of RDLs electrically couples a portion of the first plurality of VSS TSVs.

17. The integrated circuit structure of claim 16, wherein the first grid is distributed in a first portion of the semiconductor substrate, wherein the integrated circuit structure further comprises a second grid formed of a second plurality of VDD TSVs and a second plurality of VSS TSVs and distributed in a second portion of the semiconductor substrate, and wherein the first grid and the second grid have different grid sizes.

18. The integrated circuit structure of claim 16 further comprising a first plurality of metal lines in a bottom metallization layer (M1), wherein the first plurality of metal lines couples the first plurality of VDD TSVs and the first plurality of VSS TSVs to integrated circuit devices on the semiconductor substrate.

19. The integrated circuit structure of claim 16, wherein electrical connections to the first plurality of VDD TSVs are substantially limited in the M1 and a metallization layer (M2) directly over the M1, and wherein substantially none of the first plurality of VDD TSVs are electrically coupled to metal features in any metallization layer over the M2.

20. The integrated circuit structure of claim 16, wherein the first grid forms a voltage island, with the first plurality of VDD TSVs carrying a first voltage, and wherein the integrated circuit structure further comprises an additional grid comprising a second plurality of VDD TSVs carrying a second voltage different from the first voltage.

* * * * *